(12) United States Patent
Taniguchi et al.

(10) Patent No.: US 6,687,639 B2
(45) Date of Patent: Feb. 3, 2004

(54) PROCESSING SYSTEM FOR A WIRING HARNESS, A METHOD FOR TESTING AN ELECTRICAL CONNECTION OF A WIRING HARNESS, COMPUTER-READABLE STORAGE MEDIUM AND A WIRE CONNECTION ASSISTING SYSTEM

(75) Inventors: Yoshikazu Taniguchi, Yokkaichi (JP); Setsurou Mori, Ritto (JP)

(73) Assignee: Sumitomo Wiring Systems, Ltd. (JP)

(*) Notice: Subject to any disclaimer, the term of this patent is extended or adjusted under 35 U.S.C. 154(b) by 49 days.

(21) Appl. No.: 10/159,436

(22) Filed: May 30, 2002

(65) Prior Publication Data

US 2002/0183954 A1 Dec. 5, 2002

(30) Foreign Application Priority Data

May 30, 2001 (JP) ......................................... 2001-163089
May 30, 2001 (JP) ......................................... 2001-163090

(51) Int. Cl.$^7$ .......................... G06F 19/00; G01R 31/00
(52) U.S. Cl. ...................... 702/117; 702/118; 702/119; 702/121; 702/122; 702/123
(58) Field of Search ................................ 702/104, 108, 702/109, 117, 118, 119, 120, 121, 122, 123, 124, 125, 126, 186, 187; 307/9.1, 11, 18, 36–43; 29/592, 592.1, 593, 755

(56) References Cited

U.S. PATENT DOCUMENTS

| 4,853,850 A | * | 8/1989 | Krass, Jr. et al. ............. 701/35 |
| 5,448,574 A | | 9/1995 | Yamaguchi |
| 5,612,680 A | * | 3/1997 | DeSanto ...................... 29/755 |
| 2002/0180457 A1 | * | 12/2002 | Taniguchi et al. .......... 324/538 |

FOREIGN PATENT DOCUMENTS

| CA | 1329787 | 5/1994 |
| JP | 6-258371 | 9/1994 |
| JP | 6-72066 | 10/1994 |
| JP | 10-132885 | 5/1998 |

* cited by examiner

Primary Examiner—Bryan Bui
(74) Attorney, Agent, or Firm—Anthony J. Casella; Gerald E. Hespos

(57) ABSTRACT

An electrical connection test is conducted within a practical response time every time a harness-forming wire is connected on a compact assembling board. Multiplexing communication controllers adopting a perfect time-division multiplexing communication method according to which tokens are given to units by a time-division technique based on timing bit sets issued at specified intervals from any of the units and node addresses are provided. Every time a harness-forming wire is connected, an electrical connection of a network of a wiring harness including this harness-forming wire is tested. In this electrical connection test, whether the network is satisfactory is determined up to a last stage every time the harness-forming wire is connected in the production process of the wiring harness being tested.

13 Claims, 18 Drawing Sheets

FIG. 9

| Station Address n | Step No. SN | CA Data | Test Stand. Data |
|---|---|---|---|
| n1 | SN1<br>SN2<br>SN3<br>SN4<br>SN5<br>SN6<br>SN7<br>SN8<br>SN9 | DATA1<br>DATA2<br>DATA3<br>DATA4<br>DATA5<br>DATA6<br>DATA7<br>DATA8<br>DATA9 | DATA1<br>DATA2<br>DATA3<br>DATA4<br>DATA5<br>DATA6<br>DATA7<br>DATA8<br>DATA9 |
| n2 | SN10<br>SN11<br>SN12<br>SN13<br>SN14<br>SN15<br>SN16<br>SN17<br>SN18 | DATA10<br>DATA11<br>DATA12<br>DATA13<br>DATA14<br>DATA15<br>DATA16<br>DATA17<br>DATA18 | DATA10<br>DATA11<br>DATA12<br>DATA13<br>DATA14<br>DATA15<br>DATA16<br>DATA17<br>DATA18 |
| ... | | | |
| n(end) | SN(end) | DATA(end) | DATA(end)  Final Electrical Connection Test |

FIG. 12
Master Unit (260)
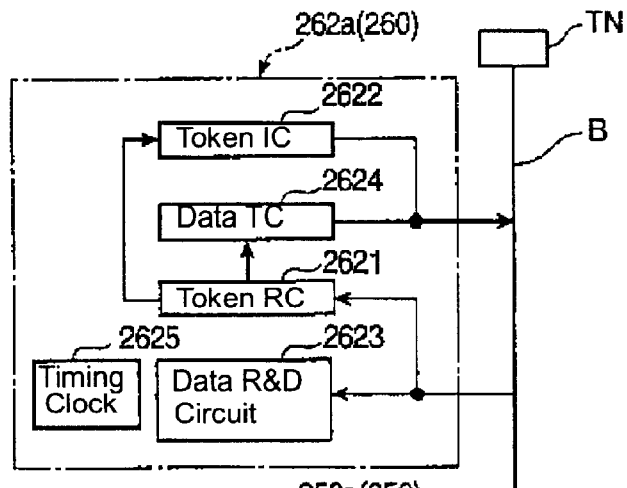
Connector Unit (250)
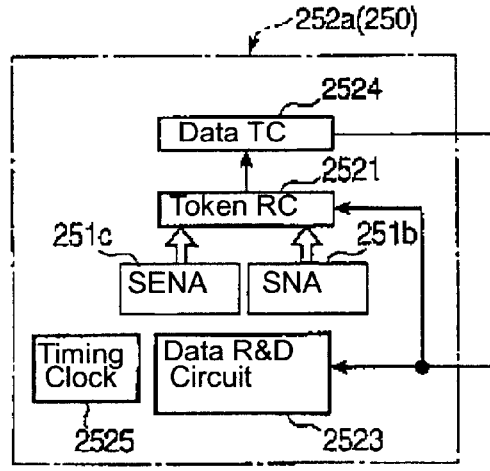
Channel Unit (300)
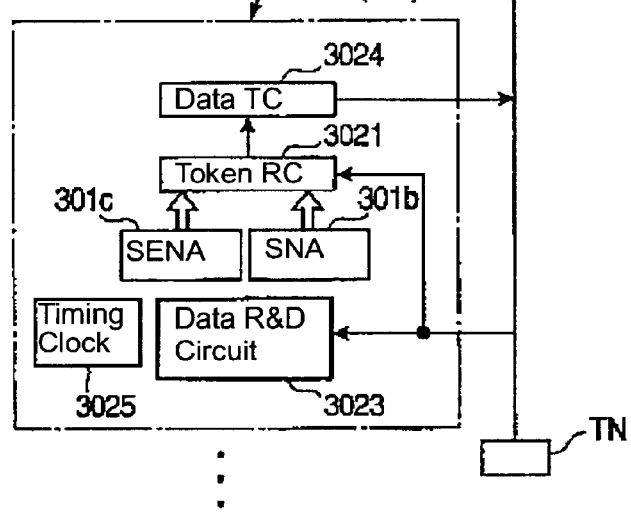

PROCESSING SYSTEM FOR A WIRING HARNESS, A METHOD FOR TESTING AN ELECTRICAL CONNECTION OF A WIRING HARNESS, COMPUTER-READABLE STORAGE MEDIUM AND A WIRE CONNECTION ASSISTING SYSTEM

BACKGROUND OF THE INVENTION

1. Field of the Invention

The invention relates to a processing system for a wiring harness, a method for testing electrical connection of a wiring harness, a computer-readable storage medium storing a computer program and a wire connection assisting system.

2. Description of the Related Art

A wiring harness is an electrical wiring system that forms a complicated network, and an electrical connection test is conducted during its production process to determine whether the constructed network is satisfactory.

Processing systems for wiring harnesses are disclosed in Japanese Unexamined Patent Publications Nos. 6-258371 and 10-132885 and Japanese Unexamined Utility Model Publication No. 6-72066. These known systems have a master unit with an electrical connection testing function and connector units to be connected with the wiring harness to enable a multiplexing communication.

In such a prior art, the wiring harness and the master unit are electrically connected via adapters provided between the wiring harness and the connector units. The multiplexing communication between the master unit and the connector unit is conducted by a so-called CSMA/CD (carrier sense multiple access with collision detection) method, and "survival arbitration" is adopted in the case that data are simultaneously outputted from a plurality of units for making a judgment based on bit lengths of two signals. The respective connector units are provided with a microprocessor to enable such a communication control and electrical connection tests.

A demand has existed in recent years to test an electrical connection of the wiring harness every time a harness-forming wire is connected during the production of the wiring harness. In this regard, a harness-forming wire is a subassembly of a wiring harness, and may be a wire cut to a specified length and having terminals connected with the opposite ends or a subassembly connected with connector (s). An electrical connection test must be conducted in real time every time an operator connects the harness-forming wire.

The survival arbitration based on the CSMA/CD method has been adopted as a communication method for electrical connection tests conducted by the above testing device. Thus, communication conditions must be established between the master unit and the connector units. Further, there is a waiting time when there is a collision of the signals. Accordingly, a response time between the end of the connecting operation and the end of the electrical connection test becomes longer, and the operator must wait longer. Therefore, the above communication method was not practical.

An attempt could be made to process the signals from the master unit and the connector units by a method other than the multiplexing communication. However, signal lines for the electrical connection test cannot physically be laid on an assembling board, and it is impossible to perform connecting operations on a compact assembling board for the large wiring harnesses that have been demanded in recent years.

More and more electronic equipment is being installed in vehicles, and wiring harnesses for the vehicles are getting larger and have complicated branch wires. Thus, wiring harnesses generally are produced by dividing the wiring harness into several subassemblies that are assembled into the wiring harness on a wire laying board.

A wire connection assisting system is known for carrying out the above-described assembly method. The system has a plurality of wire supplies for accommodating wires that have been cut to specified lengths. Terminals are connected with the opposite ends of the insulated wires in the wire supplies, and the terminated wires are sorted according to type. The terminated wires taken from the wire supplies are connected on assembling boards. More particularly, connector holders extend from the assembling boards and are adapted to hold connectors that are to be connected with the terminal-provided wires taken from the wire supplies. A wire connection instructing mechanism for identifying the wires that are to be connected with contacts of the connectors held in the respective connector holders.

The number of circuits of the subassembly to be formed has been increased (e.g. 200 to 300 circuits or 960 points or contacts) in recent years. Accordingly, there has been a demand to distribute the wire supplies to a plurality of stations and to convey the assembling boards from upstream stations to downstream stations. Wire connection instruction means need to be distributed to the stations as the wire supplies are distributed, and the wire connection instruction means at the respective stations need to identify a wire connection in cooperation with detecting elements of the connector holders.

To realize such cooperation, a master unit has been provided for each wire supply and is connected with the respective detecting elements of the connector holders via an interface connector on the assembling board. However, in such a case, it is cumbersome to connect and disconnect the interface connector, and poor operability results.

A mixed production produces many kinds of wiring harnesses in the same conveyor line. For these situations, it has been necessary to input pieces of production information of the respective wiring harnesses in all the master units at the respective wire supplies and to renew these pieces of information. Thus, a considerable amount of operation has been necessary to prepare for the mixed production.

The master units are at the wire supplies. Thus, a problem, such as a defective product, on any assembling board adversely affects the connecting operations on the other assembling boards unless problem information is transmitted to the respective master units. Accordingly, a system for enabling communication between the master units has been required.

It would be desirable to provide the master unit on the assembling board and to enable information of a single database built in this master unit to be shared by the respective connection instructing means. However, it has been necessary to establish a protocol between the master unit and the respective connection instructing means in a general multiplexing communication system. Thus, it has taken time to transmit data and, a problem of being incapable of executing practical controls has been unavoidable.

SUMMARY OF THE INVENTION

In view of the problems in the prior art, an object of the present invention is to improve operability of producing wiring harnesses by enabling electrical connection tests to be performed within a practical response time when the electrical connection test is conducted substantially every time a harness-forming wire is connected on a compact assembling board and by allowing easy, precise and continuous operations of connecting wires of a wiring harness to form a large-scale circuitry on the same assembling board.

The invention is directed to a processing system for a wiring harness in a production line for producing the wiring harness by conveying a connection board from one to another of a plurality of stations and connecting harness-forming wires to form the wiring harness on the connection board. The processing system functions to test an electrical connection at least part of a network of the wiring harness, including the connected harness-forming wire, substantially every time the harness-forming wire is connected. The system comprises a master unit for conducting an electrical connection test for the wiring harness being produced. The processing system also comprises connector units that are connected at least temporarily with the master unit to enable a multiplexing communication. The connector units also can exchange signals with at least part of the wiring harness. The processing system also comprises a multiplexing communication path for connecting the master unit and the respective connector units to enable the multiplexing communication therebetween. Different node addresses are set for the master unit and the respective connector units. Each of the master unit and the connector units comprises a multiplexing communication controller that adopts a perfect time-division multiplexing communication method according to which tokens are given to the master unit and the connector units by a time-division technique based on timing bit sets issued at specified intervals from any of the units and the node addresses. The master unit preferably has read data storage means for storing connection information of the network formed by the newly connected harness-forming wire as read data based on a data packet sent from the connector unit via the multiplexing communication with the connector unit by the perfect time-division multiplexing communication method. The master unit also has test standard data storage means for storing test standard data as a standard of the electrical connection test. The master unit also preferably has a discriminating means for discriminating whether contacts of the network are connected properly by comparing the read data and the test standard data. The test standard data storage means stores electrical connection test information of the network built by the harness-forming wires as the test standard data up to a final stage for each harness-forming wire, and the discriminating means discriminates whether the network is satisfactory up to the last stage based on the test standard data every time the harness-forming wire is connected in the production process of the wiring harness being tested.

Accordingly, the tokens are given to the respective units by the time-division technique based on the timing bit sets issued at the specified intervals from any of the units and the node addresses. Electrical connection of the network is tested every time a harness-forming wire is connected as an element of the wiring harness on the connection board being conveyed from one to another of the plurality of stations. Thus, it is not necessary to establish communication conditions between the units, and the data can be transmitted and received between the units without a protocol, thus improving operability. Therefore, an elapsed response time between the end of the electrical connection test and the end of the operation of the connecting the harness-forming wire can be shortened remarkably, and the next connecting operation can follow without making an operator wait.

It is unnecessary to establish communication conditions between the master unit and the connector units. Thus, each connector unit need not have a microprocessor, and a simple inexpensive hardware construction can be adopted. Further, since a protocol-free communication mode can be adopted, it is unnecessary to develop software to establish a protocol between the nodes, and costs can be reduced.

The multiplexing communication between the master unit and the connector units enables simplified wiring between the respective units, and thus the electrical connection test can be conducted on a compact board even if the wiring harness has a large number of circuits (e.g. having 960 contacts).

The perfect time-division multiplexing communication method, enables multiplexing communication between the respective units merely by setting the timing bit sets outputted at the specified intervals and the node addresses. Thus, the connector units can be increased and decreased easily, and changes in hardware specifications of the wiring harness can be dealt with easily.

The "harness-forming wire" may be a terminated wire formed by connecting terminals at the opposite ends of an insulated wire or a partial harness formed by connecting a plurality of terminal-provided wires.

A connector-side connection instructing means is associated with each connector holder to indicate a connection end of the harness-forming wire. The master unit further comprises a connection assisting data storage means for storing connection assisting data for the wiring harness being produced and connection instruction control means for controlling a connection instruction by the connector-side connection instructing means via the multiplexing communication controller based on the read data and the connection assisting data.

A connected state of the harness-forming wire with the connector held in the connector holder can be read as the connection information by the master unit by conducting the multiplexing communication between the master unit and the connector unit. The connector-side connection instructing means of the connector holder connected with this connector unit can be controlled by instructing connection assistance to the connector unit in accordance with the read connection information.

The invention also is directed to a method for testing an electrical connection of a network of a wiring harness including harness-forming wires substantially every time the harness-forming wire is connected. The method preferably uses a processing system as described above and can be employed in a production line for producing the wiring harness by conveying a connection board from one to another of a plurality of stations and connecting the harness-forming wires to form the wiring harness on the connection board. The method comprises setting different node addresses for a master unit for conducting an electrical connection test for the wiring harness being produced and a plurality of connector units for connecting the master unit with the wiring harness. The method then comprises giving tokens to the respective units by a time-division technique based on timing bit sets issued at specified intervals from any of the units and the node addresses according to a perfect time-division multiplexing communication method. The method further comprises determining whether the network is satisfactory up to a final state by the perfect time-division multiplexing communication method for substantially every harness-forming wire connected in the production process of the wiring harness being tested.

The invention also is directed to a computer-readable storage medium that stores a computer program. The storage medium comprises computer-readable program means for causing a computer to control the execution of the above-described method for testing an electrical connection of a network of a wiring harness, including harness-forming wires, when the method is run on a computer. The invention also relates to a computer program and a computer program product directly loadable into the internal memory of a digital computer, comprising software code portions for performing the steps of a method for testing an electrical connection of a network of a wiring harness including harness-forming wires as described above.

The invention relates to a wire connection assisting system that preferably includes the above-described processing system. The wire connection assisting system comprises a wire supply for terminated wires formed by connecting terminals with the opposite ends of insulated wires cut to specified lengths while sorting the terminated wires beforehand according to type. The system also comprises an assembling board on which the terminated wires taken from the wire supply are to be connected. Connector holders are on the assembling board and each includes a connector accommodating portion for holding a connector to be connected with the terminated wire taken from the wire supply and a detecting element electrically connectable with a terminal of the terminated wires inserted into the connector in the connector accommodating portion. A wire-side connection instructing means is provided at the wire supply for given an instruction of taking out the wire or a specific wire in the wire supply. A connector-side connection instructing means is provided in correspondence with the respective connector holders for displaying a connection end that corresponds to the connector with which the terminated wire is to be connected. A master unit is provided on the assembling board to be at least temporarily electrically connectable with the respective detecting elements for controlling the respective connection instructing means. A wire-side node unit is at least temporarily connectable with the master unit for enabling a multiplexing communication and for driving the wire-side connection instructing means based on a control of the master unit. A connector-side node unit is at least temporarily connectable with the master unit for enabling a multiplexing communication and is adapted to control the detecting elements of the connector holders and the wire-side connection instructing means based on the control of the master unit. A multiplexing communication control system connects the master unit and the node unit as nodes to enable the multiplexing communication therebetween. The connection of harness-forming wires to form a wiring harness is assisted by controlling the respective connection instructing means based on information of a single database built in the master unit and a connection information of the harness-forming wires to be connected with the connectors on the assembling board. The multiplexing communication system further preferably comprises a node address setting means for setting different node addresses for the respective nodes, a token issuing means for issuing timing bit sets as token signals at specified intervals, and a token reception controller for giving the tokens to the respective nodes by a time-division technique based on the timing bit sets issued by the token issuing means and the node addresses.

Accordingly, a perfect time-division multiplexing communication method is adopted by providing the master unit on the assembling board and by conducting the multiplexing communication with the respective connection instructing means. The method gives tokens to the respective nodes (the master unit and the respective node units) based on the timing bit sets as the token signals issued at the specified intervals and the node addresses set for the respective nodes upon controlling the respective connection instructing means based on the information of the single database in the master unit. Thus, it is not necessary to establish communication conditions between the nodes for transmitting and receiving data, and data can be transmitted and received preferably without a protocol. This remarkably shortens response time between the nodes for transmitting and receiving the data. Thus, even if the wires are instructed to the respective connection instructing means in a complicated manner, the connection instructing means can be controlled quickly to improve operability. This enables a unitary administration of connection assisting information and electrical connection test information of a large wiring harness by the master unit using the single database, and the data can be administered and renewed more easily. Further, since the protocol-free communication mode can be adopted, it is not necessary to develop software for establishing a protocol between the nodes, and costs are reduced.

The master unit may test electrical connection of a network including the connected harness-forming wire substantially every time the harness-forming wire is connected with the connector in the connector holder. The master unit causes the respective connection instructing means to assist a next connecting operation only if there is a success in an electrical connection test. Thus, the electrical connection test is conducted every time the connecting operation is performed, and an erroneous connection can be detected by a real-time response to prevent a defective product from being conveyed to a later step. The perfect time-division multiplexing communication method remarkably shortens the time required for the electrical connection test. Thus, processing time between one set of the connecting operation and the electrical connection testing operation and the next set can be shortened, with the result that an operator needs not spend time waiting.

Wire supplies may be at each of a plurality of stations along the conveyance path of the assembling boards, and the master unit tests the electrical connection up to the last stage of the production process of the wiring harness being tested. This arrangement enables the wire connection to be instructed seamlessly from the first station to the last even if wire supplies are installed at a plurality of stations. Therefore, even if the operator is changed between the respective stations or the operation is interrupted, there is no variation in the quality of the connecting operations.

A mixed production can be made more easily by providing the master unit on the assembling board because trouble or a defect on any assembling board has no influence on the controls on the other assembling boards.

Further, the information of the single database is shared and the connecting operations are assisted at all the stations. Thus, it is not necessary to provide means for preventing a connection error of the operator by sorting the insulated wires of the products by color. As a result, the kinds of the insulated wires can be reduced and the production cost can be reduced.

The wire-side node unit may comprise a gateway for conducting a multiplexing communication with an external network. Thus, a communication line built with the master unit as a center can be connected with external networks to enable a multiplexing communication, thereby enabling various operations to be performed. For example, the data can be taught remotely to and changed in a storage means of the master unit by way of an external network. Further, the behavior of the wire connection assisting system having the master unit as a center can be monitored as it is via the external network. Hence, supplementary functions of the wire connection assisting system, such as maintenance and warnings, can be added.

The assembling board may comprise temporary holding jigs for temporarily holding the other ends of the terminated wires determined as free terminals that are to be connected when the subassembly is assembled into the wiring harness. The connector-side node unit is provided for each of the temporarily holding jigs and is connected with a terminus end instructing means for instructing the temporarily holding jig when the free terminal is brought into contact with a grounding member. The individual free terminals can be supported respectively at the suitable temporarily holding positions. As a result that the wire connecting operation can be performed efficiently.

These and other objects, features and advantages of the present invention will become more apparent upon reading of the following detailed description of preferred embodiments and accompanying drawings. It should be understood that even though embodiments are separately described, single features thereof may be combined to additional embodiments.

BRIEF DESCRIPTION OF THE DRAWINGS

FIG. 9 is a data table showing data used in this embodiment in a list format.

FIG. 12 is a block diagram showing multiplexing communication controllers of the master unit, the connector units and the channel units in detail.

DETAILED DESCRIPTION OF THE PREFERRED EMBODIMENTS

Figure 1:
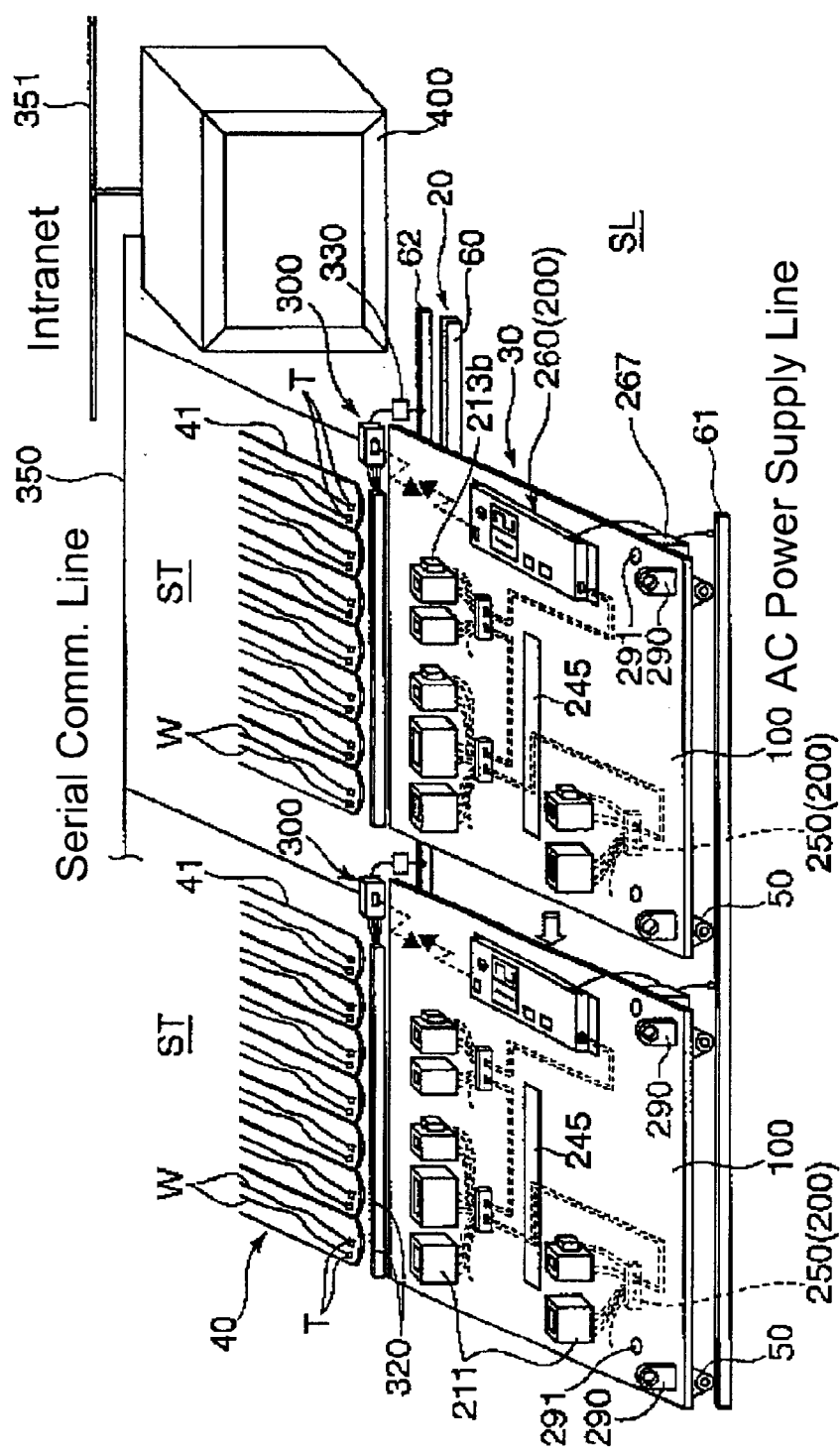
FIG. 1 is a perspective view diagrammatically showing a schematic construction of a production line adopting a wire connection assisting system according to one embodiment of the invention.

A production line for a wire connection assisting system 10 is illustrated schematically in FIG. 1, and includes an unillustrated main line for finishing a final wiring harness and a plurality of subassembly lines SL connected with the main line in a branched manner. Each subassembly line SL includes a conveyor 20 for producing a subassembly, an assembly board unit 30 conveyed by the conveyor 20, and a wire supply table 40 for stocking terminal-provided wires W for the subassembly.

The conveyor 20 is successively moved on a hand-pushable conveyance truck 50 to several stations ST in the subassembly line SL, so that a specified processing can be applied at each station ST. A specified subassembly is produced by inserting the terminated wires W into corresponding connectors C at the respective stations ST.

Channels 41 of substantially rectangular cross section are provided in the wire supply table 40. This wire supply table 40 is used to sort all kinds of terminated wires W necessary to form a subassembly into several groups in accordance with a production procedure, and is allotted to each of a plurality of stations ST set in the subassembly line SL from an upstream side in accordance with the production procedure.

The respective channels 41 are adapted to stock a plurality of kinds of terminated wires W while sorting them according to the kind.

Each wire supply table 40 has a channel unit 300, as a wire-side node unit, which is part of a terminal insertion assisting unit 200 and guide lamps 320, as a wire-side connection instructing means, are mounted near take-out openings of the respective channels 41 in one-to-one correspondence with the channels 41 and connected with the corresponding channel unit 300. The kind of the terminal-provided wire W to be taken out by an operator can be specified by selectively turning on the guide lamps 320.

Each conveyance truck 50 is conveyed manually along a pair of rails 60 (only one rail is shown in FIG. 1) in the conveyor 20 to a plurality of stations ST along the rails 60 from an upstream side to a downstream side. A power supply 61 is provided on the inner sides of the rails 60 for supplying power to control units on each conveyance truck 50 as described later and a power supply line 62 is provided for supplying power to the channel unit 300. A measure to prevent an electric shock is provided for these power supply lines 61, 62 by the rails 60 and unillustrated covers.

Figure 2:
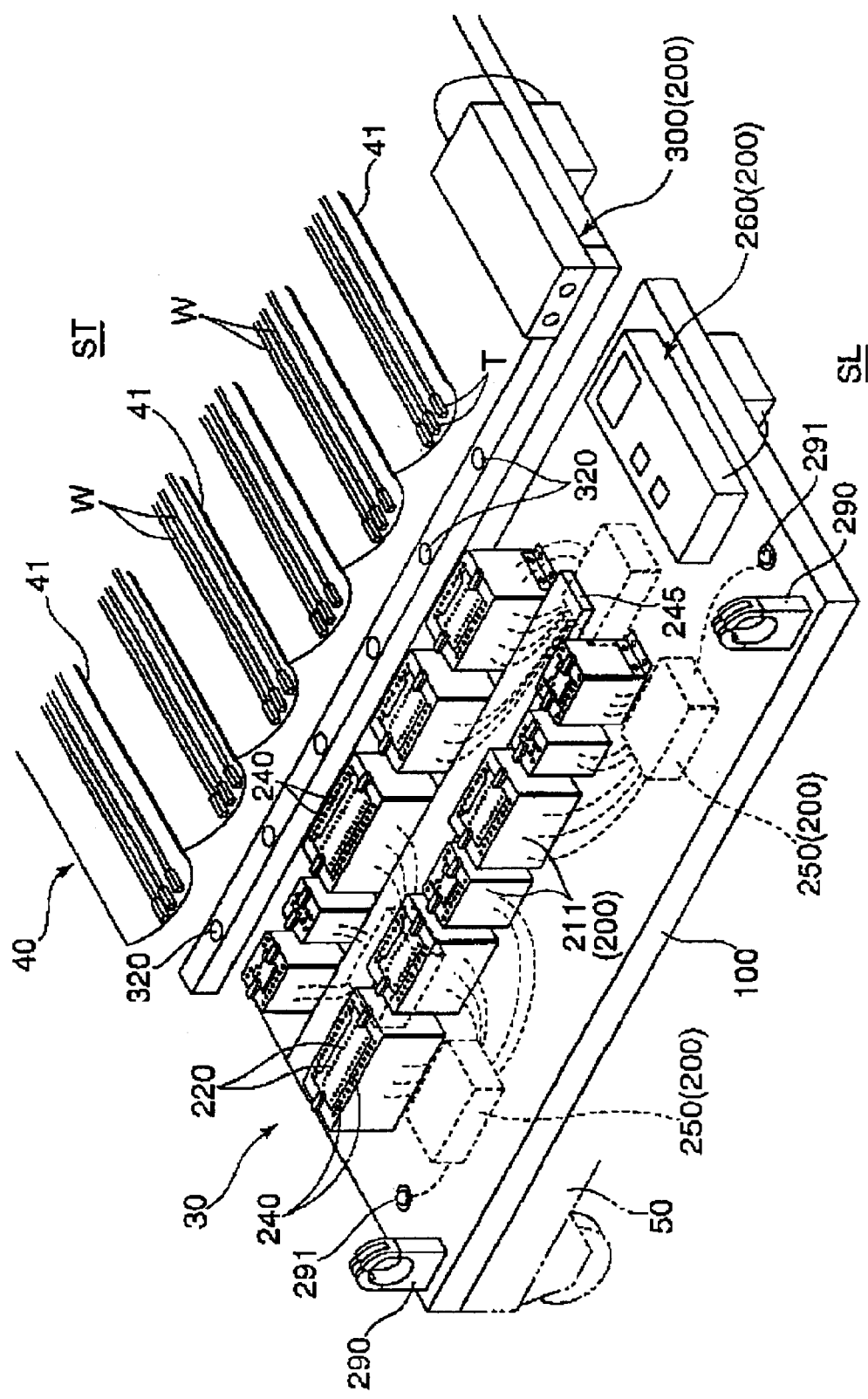
FIG. 2 is a perspective view showing an essential portion of FIG. 1.

Each assembling board unit 30 has an assembling board 100 fixed to the conveyance truck 50, as shown in FIG. 2. The assembling board 100 is a work table on which the operator connects the wires. This assembling board 100 has connector holders 211, probes 220 as detecting elements provided in the connector holders 211, guide lamps 240 as connector-side connection instructing means attached or associated to the connector holders 211 in correspondence with the probes 220, connector units 250 connected with the probes 220 and the guide lamps 240, and a master unit 260 connected with the connector units 250. The elements 211, 220, 240, 250, 260 comprise the terminal insertion assisting unit 200 of this embodiment.

Figure 3:
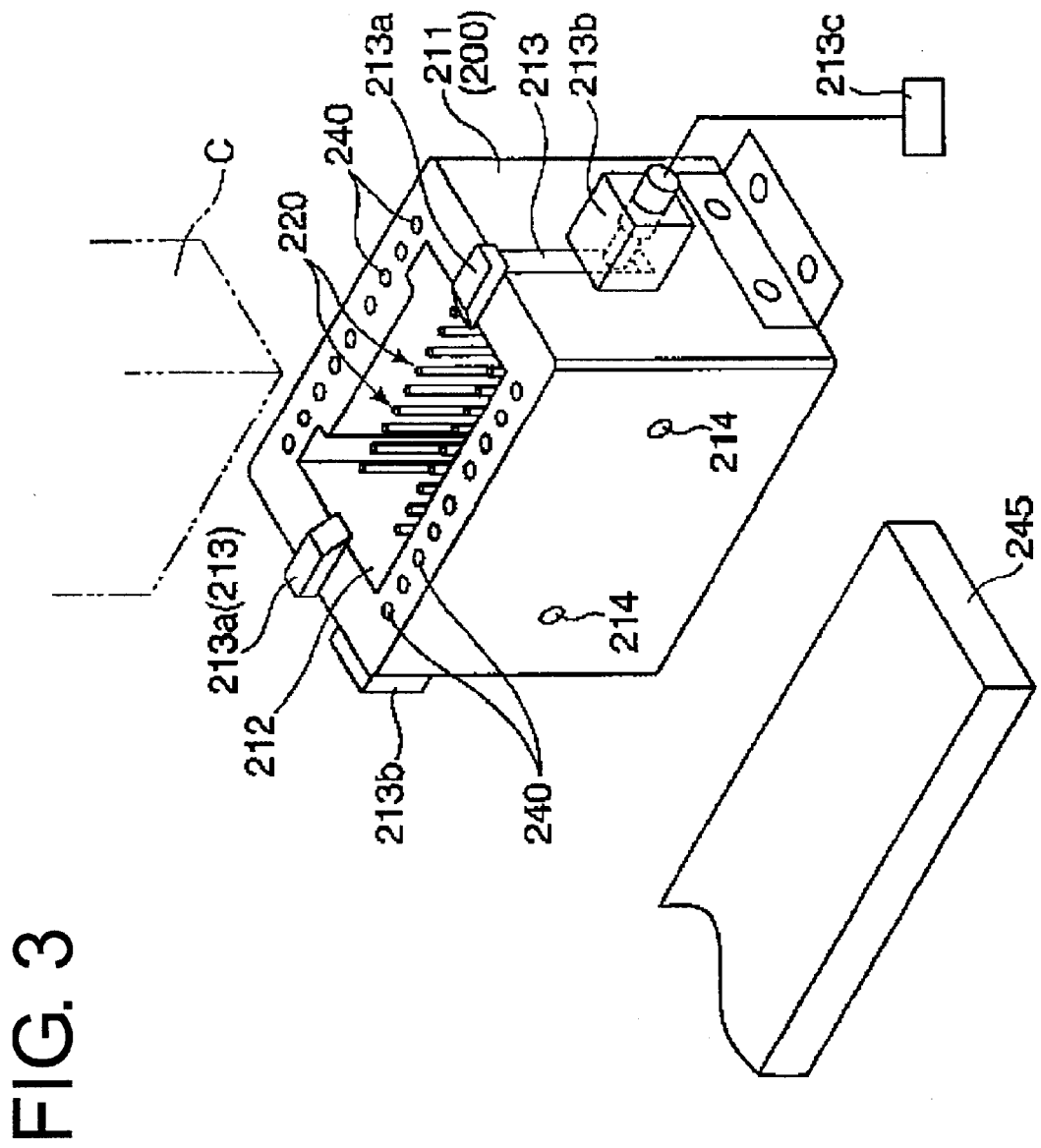
FIG. 3 is an enlarged perspective view showing an essential portion of a wire connection instructing mechanism of FIG. 1.
Figure 4:
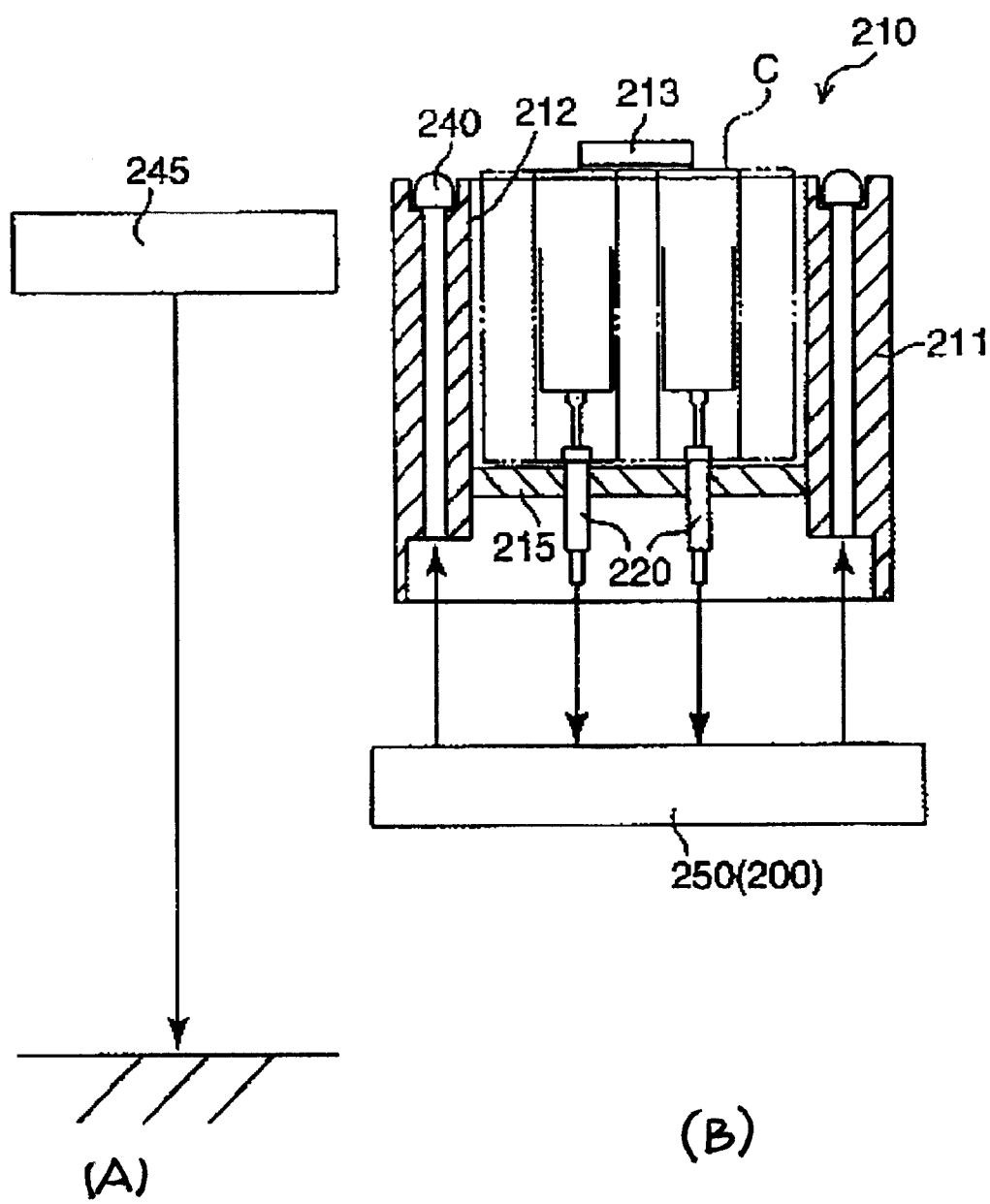
FIG. 4A is an enlarged schematic section showing the essential portion of the wire connection instructing mechanism of FIG. 1.
FIG. 4B is a schematic section through a preferred probe for use with the wire connection instructing mechanism of FIG. 1.
Figure 5:
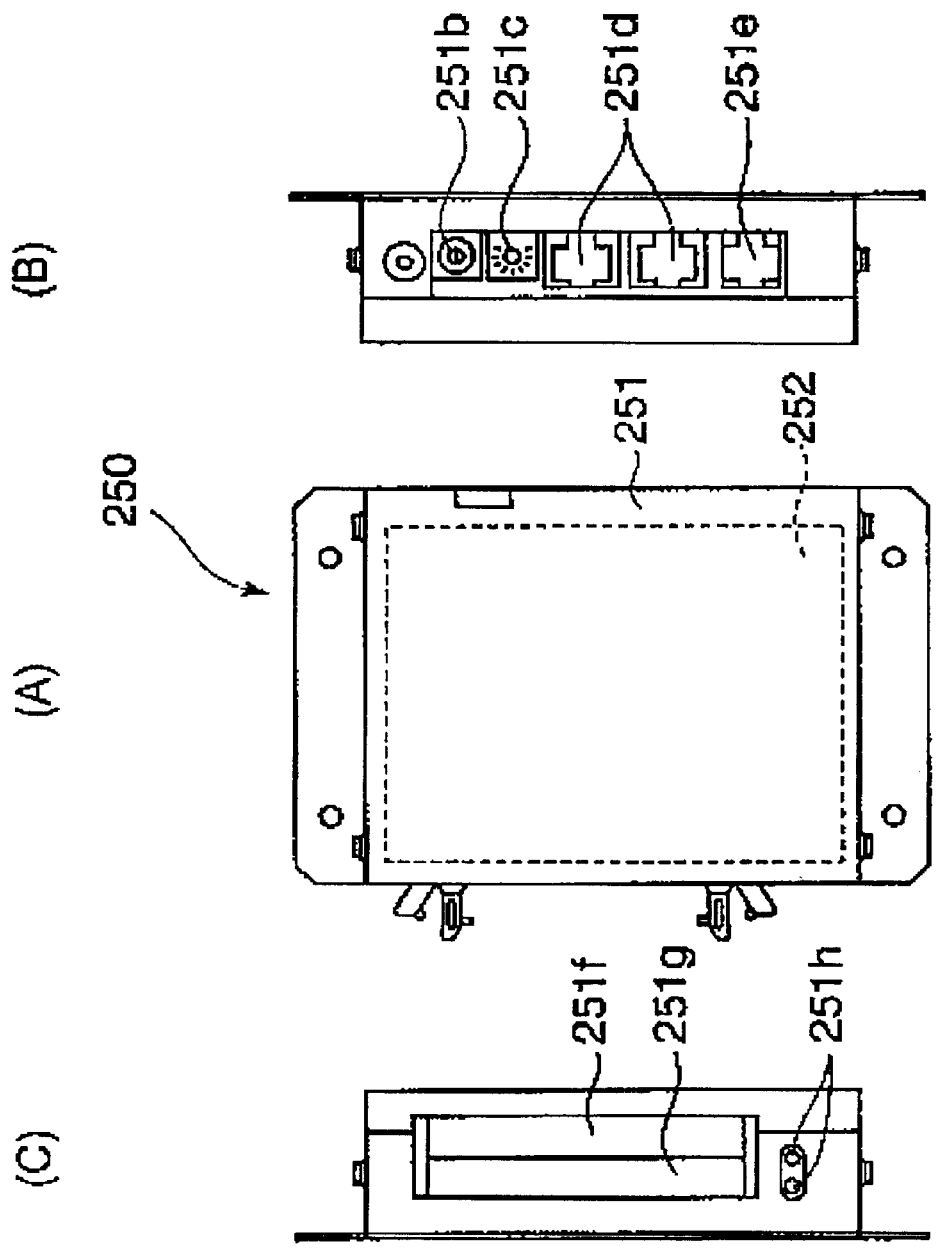
FIGS. 5(A), 5(B) and 5(C) are a front view, a right side view and a left side view showing the external construction of a connector unit.

With reference to these FIGS. 3 to 5, each connector holder 211 has a substantially rectangular parallelepipedic outer shape and has a substantially bottomed connector accommodating portion 212 with an opening in its upper surface that conforms with the outer shape of a connector C to be accommodated (shown only in phantom line in FIGS. 3 and 4). As shown in FIG. 2, the connector holders 211 take various shapes in conformity with the number of contacts and the shapes of the connectors C to be held. A plurality of the connector holders 211 are arranged to accommodate the corresponding connectors C in the connector accommodating portions 212 of the respective connector holders 211. Thus, one end of the terminated wire W is connected with or at least partly inserted into the connector C in one connector holder 211, and the other end thereof is connected with the connector C in another connector holder 211. A pair of locks 213 are mounted on the sides of the connector holder 211 for rotation about pins 214, and the connector C is prevented from coming out up by locking claws 213a that are urged into engagement with the upper surface of the connector C by unillustrated resilient members. Air cylinders 213b are provided on the sides of the connector holder 211 for driving the respective locks 213 in unlocking direction. The air cylinders 213b are driven by starting and ending the supply of pressurized air from an unillustrated pressurized air supplying device by means of solenoid valves 213c, which can be controlled by the connector units 250 and the master unit 260 to be described later.

The connector holders 211 are arranged in an order corresponding to an arrangement order at the unillustrated main line. Thus, the subassembly formed at the connecting process can be conveyed efficiently to the main line by keeping its form maintained.

A probe holding plate 215 is fixed at the bottom of the connector accommodating portion 212 of each connector holder 211, as shown in FIGS. 4A and 4B. The probe holding plate 215 defines a placing surface for receiving the bottom of the connector C in the connector accommodating portion 212 and for holding the probes 220. The probes 220 are provided in one-to-one correspondence with the contacts (terminal cavities) of the connector C held in each connector holder 211. The probes 220 enter the respective terminal cavities of the connector C while the connector C is moved into the connector accommodating portion 212. The probes 220 then connect with the terminated wires W by mounting the ends of the terminated wires W into the respective terminal cavities. The probes 220 are formed as described in European patent application EP 00 114 021.0, which is incorporated herein by reference.

With reference to FIGS. 3 and 4A, the connector holder 211 has a plurality of guide lamps 240 to indicate the contacts of the connector C to be accommodated.

The guide lamps 240 preferably are light-emitting diodes (LED), and are one example of the connector-side connection instructing means to be connected with the master unit 260 via the connector units 250 to be described later. The guide lamps 240 alternatively may be provided as a display, such as a liquid crystal display (LCD). A touch plate 245 is mounted on the assembling board 100 as a grounding member electrically connected with a ground.

As shown in FIGS. 1 and 2, the assembling board unit 30 has temporarily holding jigs 290 for temporarily holding the terminated wires W that have "free terminals", i.e. terminals not to be inserted into a connector C at the present stage or processing step. The temporarily holding jigs 290 are commercially available resilient clamps, and a plurality of temporarily holding jigs 290 are provided to conform to the configuration of a wire assembly to be formed. The assembling board 100 further has guide lamps 291 as end designating means near the temporarily holding jigs 290. The guide lamps 291 are connected with and controlled by the master unit 260 via the connector units 250.

The connector unit 250 forms a connector-side node unit with a casing 251 fixed to the rear surface of the assembling board 100 and a base plate 252 in or on the casing 251, as shown in FIGS. 5(A) to 5(C). The base plate 252 has a self node address setting switch 251b, a sending-end node address setting switch 251c, a modular jack 251d for communication, a modular jack 251e for driving the solenoids or solenoid valves 213c for the air cylinders 213b, a probe-connector connecting portion 251f with which socket connectors (not shown) of probes 220 can be connected, and a lamp-connector connecting portion 251g with which socket connectors (not shown) of the guide lamps 240 can be connected. The connecting portions 251f, 251g are on the left side surface of the casing 251. The socket connectors of the guide lamps 291 can be connected with the lamp-connector connecting portion 251g by letting the guide lamps 291 of the temporarily holding jigs 290 and the socket connectors (not shown) in the guide lamps 291 have the same specifications as the guide lamps 240 of the connectors 211 and the socket connectors connected with the guide lamps 240.

Figure 6:
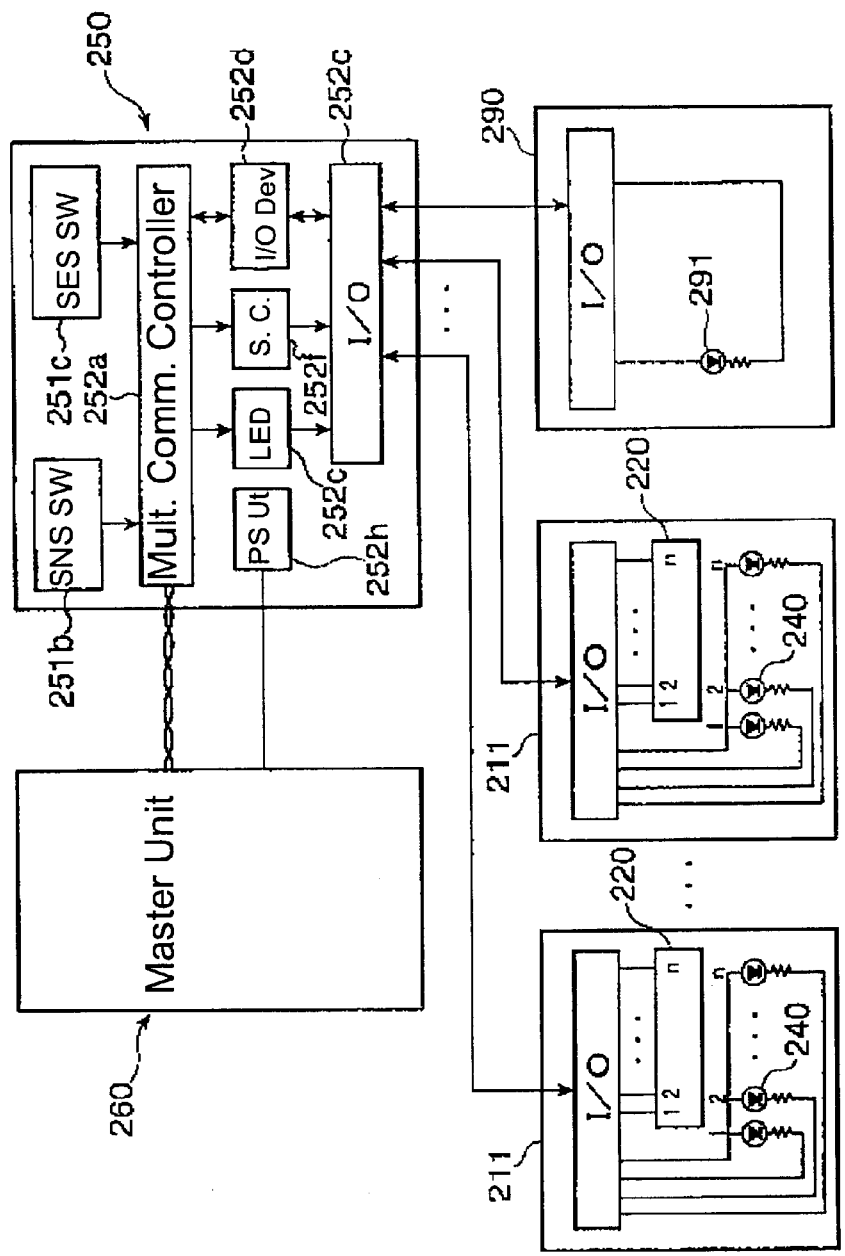
FIG. 6 is a block diagram showing the connector unit and elements connected therewith according to the embodiment of FIG. 1.

The base plate 252 of the connector unit 250, as shown in FIG. 6, includes a multiplexing communication controller 252a connected with the address setting switches 251b, 251c, an I/O port 252c, an input/output device 252d, a LED controller 252e, and a solenoid driver or solenoid valve driver 252f.

The multiplexing communication controller 252a sets self node addresses and sending-end node addresses by means of the self node address setting switch 251b and the sending-end node address setting switch 251c, and conducts a time-division multiplexing communication between the connector unit 250 and the master unit 260 to be described later by a communication line connected with the modular jack 251d for communication.

The I/O port 252c is an interface with the probes 220 connected with the probe-connector connecting portion 251f, the lamp-connector connecting portion 251g, and the guide lamps 240, 291.

The input/output device 252d is connected with the probes 220 via the I/O port 252c and can discriminate the individual probes 220 by inputting signals to the probes 220 and sending outputs from the probes 220 to the master unit 260.

The LED controller 252e can be connected with the guide lamps 240 and/or the guide lamps 291 via the I/O port 252c, and can selectively turn on or off or blink the guide lamps 240, 291 in accordance with controls of the master unit 260.

The solenoid driver 252f includes the modular jack 251e for solenoid, and can drive the unillustrated solenoids or solenoid valves based on an output from the master unit 260 to drive the locks 213 of the connector holder 211 by means of the air cylinders 213b.

A power supply unit 252h causes the respective elements to operate upon receiving a power supply from the master unit 260.

With reference to FIGS. 7(A) to 7(D), the master unit 260 has a vertically long casing 261, and a controller 262 is built in the casing 261. A buzzer 263 and an infrared communication unit 264 are provided in the controller 262, and are accommodated in the casing 261.

The controller 262 has setting switches 261a to 261f on the front of the casing 261, and a product-number display panel 261g, and a station-number display panel 261h. Further, the controller 262 is connected with a dip switch 261i at the right side of the casing 261, an optional unit connection port 261j, a power switch 261m, and an AC adapter connection port 261n. The controller 262 also is connected with a modular jack 261p on top of the casing 261 to enable a multiplexing communication with the respective connector units 250 via the modular jack 261p (see FIG. 8). The controller 262 further has a check-switch connection 261r at the bottom of the casing 261, and can implement a specified program based on outputs from operation switches (shown only in FIG. 8) connected with the check-switch connecting portion 261r.

The infrared communication unit 264 has a communication port 264a on top of the casing 261.

Figure 8:
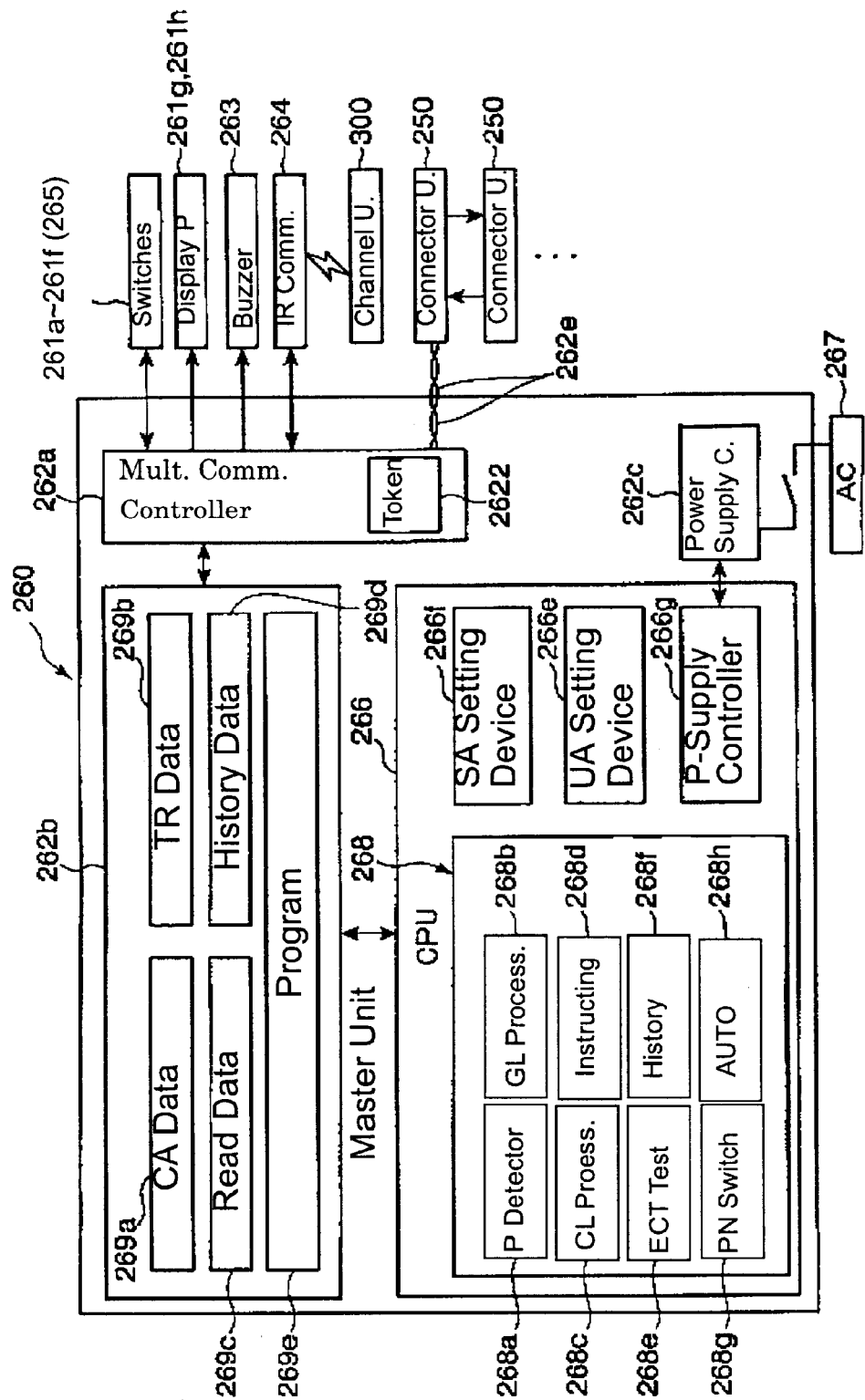
FIG. 8 is a block diagram showing a connected state of the master unit with the connector units and channel unit.

With reference to FIG. 8, the controller 262 has a multiplexing communication controller 262a, a storage 262b and a power-supply control circuit 262c. These devices 262a to 262c are connected with a CPU 266 for controlling the operations of the controller 262 as well as with the setting switches 261a to 261f, the display panels 261g, 261h, the buzzer 263 and the infrared communication unit 264.

Figure 7:
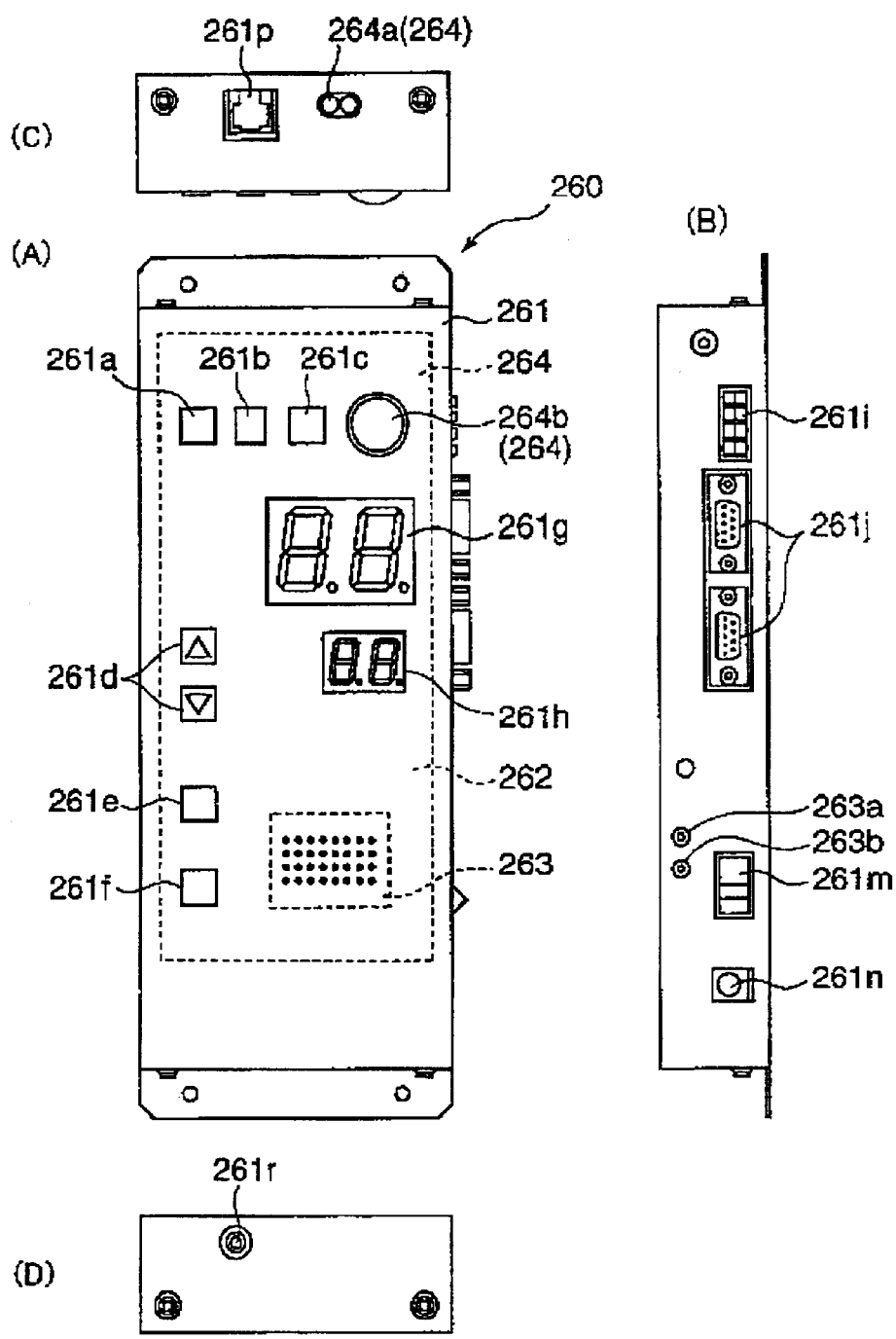
FIGS. 7(A), 7(B), 7(C) and 7(D) a front view, a right side view, a plan view and a bottom view showing the external construction of a master unit.

The multiplexing communication controller 262a is connected with the multiplexing communication controller 252a of one connector unit 250 via twisted pair cables 262e connected with the modular jack 261p shown in FIG. 7(C). The master unit 260 builds a local area network (LAN) as a master node connected with a bus-shaped multiplexing communication path while using the respective connector units 250 as slave nodes by connecting the multiplexing communication controllers 252a of the respective connector units 250 by the unillustrated twisted pair cables.

Each multiplexing communication controller 262a of this embodiment includes a token issuing circuit 2622 for issuing tokens to the respective controller units 250 as slave nodes, and is connected with the respective switches 261a to 261f, 265, the display panels 261g, 261h, the buzzer 263 and the infrared communication unit 264.

With reference to FIG. 8, the storage 262b is a ROM and a RAM, and includes a connection assisting data storage section 269a for storing connection assisting data used to assist the connection, a test standard data storage section 269b for storing test standard data used for an electrical connection test, a read data storage section 269c for storing connection information of a network formed by the terminated wires W to be tested as a read data, a history data storage section 269d for storing a history information as history data, and a program storage section 269e for storing a program for controlling the master unit 260.

FIG. 9 is a data table showing data used in this embodiment in a list format.

As shown in FIG. 9, the connection assisting data and the test standard data both are classified for the respective station addresses "n" of the stations ST, and data at the respective station addresses are registered in the order of step numbers SN performed to connect the terminated wires.

Thus, in a connection assisting operation, the connection can be cumulatively assisted from a first connecting operation to a final connecting operation and the electrical connection test can be conducted in a plurality of stations ST.

The connection assisting data storage section 269a and the test standard data storage section 269b store data corresponding to a plurality of product numbers, so that operation data corresponding to the product number selected based on the processing of a product number switching device 268g and an automatic processing device 268h can be developed.

An operation of teaching the respective data is performed by operating the setting switches 261a to 261f similar to a general control unit. Alternatively, the respective data can be downloaded from a computer 400.

The power supply control circuit 262c controls a power supply from an AC adapter 267 (shown only in FIG. 1) connected with the AC adapter connection port 261n. The power switch 261m shown in FIG. 7(B) is inserted between the power supply control circuit 262c and the AC adapter 267. The AC adapter 267 is connected slidably or movably electrically with the power supply line 61 (see FIG. 1) in the subassembly line SL as shown in FIG. 1, and is constructed to supply power from the power supply line 61.

The infrared communication unit 264 can conduct multiplexing communication with an infrared communication unit 304 of the channel unit 300 via the communication port 264a (see FIG. 7(C)). When the infrared communication unit 264 communicates with a communication port 304a (see FIG. 13(E)) of the infrared communication unit 304 of the channel unit 300, a display lamp 264b shown in FIG. 7(A) is turned on to display such a state.

The CPU 266 includes a unit address discriminator 266e for recognizing the respective connector units 250, a station address discriminator 266f for discriminating the station addresses "n" of the channel units 300 to be described later, a power supply controller 266g for controlling the power supply control circuit 262c, and a connection assisting device 268 for controlling signals from the probes 220 (see FIGS. 2 to 6) of the connector holders 211.

The unit address discriminator 266e contributes to an operation of specifying the probes 220 and the guide lamps 240 handled by the connection assisting device 268 by specifying the addresses of the connector units 250.

The station address discriminator 266f specifies the station address "n" of the station ST where the wire supply table 40 is installed based on a value set in a station address setting portion for the channel unit 300 at each station ST, thereby contributing to control of the connection assisting device 268.

The connection assisting device 268 includes a probe detector 268a for detecting a voltage of the probe 220 corresponding to the terminated wire W to be instructed; a guide lamp processor 268b for controlling the guide lamps 240 of the connector holders 211 or the guide lamps 291 of the temporarily holding jigs 290; a channel lamp processor 268c for controlling the guide lamps of the wire supply table 40 to be described later; an instruction processor 268d for controlling the guiding of the terminated wires W; an electrical connection testing device 268e for governing or administering the electrical connection test for the connected terminated wire W; a history processor 268f for processing a history information of the electrical connection test; the product number switching device 268g for switching the product numbers to be processed by the respective processors 268a to 268f; and the automatic processing device 268h for automatically performing the switching operation by the product number switching device 268g.

The probe detector 268a detects the voltage of the probe 220 corresponding to the terminated wire W to be identified. Although not specifically shown, a circuit through which a detection current flows is formed in each probe 220, preferably via a pull-up resistor. If another rod 223 of the probe 220 is disconnected from the ground, the voltage level of this other rod 223 rises and such a shift can be detected by a voltage difference.

The guide lamp processor 268b can selectively turn on or blink the guide lamps 240, 291 (or switch a corresponding display) corresponding to the terminated wire W to be identified.

The channel lamp processor 268c is connected with the guide lamps 320 of the wire supply table 40 and can selectively turn on the guide lamp 320 corresponding to the terminal-provided wire W to be identified.

The instruction processor 268d governs identification an "A-end" and "B-end" of the terminated wire W to be selected from the wire supply table 40.

The electrical connection testing device 268e checks whether the A-end and B-end of the terminated wire W are connected properly based on the test standard data registered in the storage 262b beforehand every time the A-end and B-end are connected, and can conduct an electrical connection test for all circuits when all the terminal-provided wires W corresponding to each station ST are connected.

The history processor 268f stores the electrical connection tests conducted by the electrical connection testing device 268e and the operations performed by the respective lamp processors 268b, 268c to turn on and off and blink the guide lamps 240, 291, 320 as history information in the history data storage section 269d of the storage 262b. The history information is used to turn on the guide lamp 240 corresponding to an unfinished operation when the operator operates the operation switch 265. This function is used, for example, if the operator does not know where to start the operation after interrupting it.

The product number switching device 268g specifies the product number of the subassembly to be formed for each assembling board 100 on which the master unit 260 is provided. Thus, the product numbers of the subassemblies can be administered for each of the assembling boards.

The automatic processing device 268h automatically sets the product switching operation by the product number switching device 268g. Specifically, if the address "n" of the station ST is changed based on output from the station address setting portion 306 of the channel unit 300, the product number switching operation changes automatically in accordance with a changed value.

With reference to FIGS. 10(A) to 10(E), the shown channel unit 300 forms the wire-side node unit in this embodiment and has a casing 301. The casing 301 is provided internally with a gateway unit 302, a power supply unit 303, the infrared communication unit 304 and a LED controller 305.

The gateway unit 302 has two multiplexing communication controllers 302a, 302b corresponding to a pair of modular jacks 301d for communication and is connected with both a self node address setting switch 301b and a sending-end node address setting switch 301c provided on the right side surface of the casing 301, and a W/R control logic circuit 302d for controlled switching of the respective multiplexing communication controllers 302a, 302b. Further, the gateway unit 302 is connected with a rotary switch 301e for system control via an unillustrated I/O unit, a LED 301f for action display, and a lamp-connector connecting portion 301g on the left side of the casing 301 and connected with socket connectors (not shown) of a plurality of guide lamps 320.

The multiplexing communication controllers 302a, 302b and the W/R control logic circuit 302d form a gateway for connecting a communication network between the channel unit 300 and the master unit 260 and another network (e.g. Intranet) or bi-/multidirectional communication system built in a factory.

One multiplexing communication controller 302a is connected to enable a multiplexing communication with the master unit 260 via the infrared communication unit 304, and can send an instruction signal to the LED controller 305 in response to an instruction from the master unit 260, thereby selectively turning on the guide lamps 320 as the wire-side connection assisting means.

The other multiplexing communication controller 302b is connected with the computer 400 for monitoring via a serial communication cable 350 and is connected with an Intranet or bi-/multidirectional communication system 351 built in the factory via the computer 400.

The power supply unit 303 includes an AC adapter connection port 303a on the upper surface of the casing 301 and controls a power supply from an AC adapter 330 (FIG. 1) connected with the AC adapter connection port 303a. The power supply unit 303 has a power switch 303b shown in FIG. 10(D). The AC adapter 330 is connected electrically with the power supply line 62 (see FIG. 1) in the subassembly line SL as shown in FIG. 1 to supply a power from the power supply line 62.

The infrared communication unit 304 conducts a bilateral or bidirectional communication with the infrared communication unit 264 of the master unit 260 and includes the communication port 304a on the bottom surface of the casing 301. The gateway unit 302 can control the LED controller 305 in accordance with a signal from the master unit 260 received by the infrared communication unit 304 through the communication port 304a, thereby selectively turning on the guide lamps 320 controlled by the LED controller 305.

Figure 11:
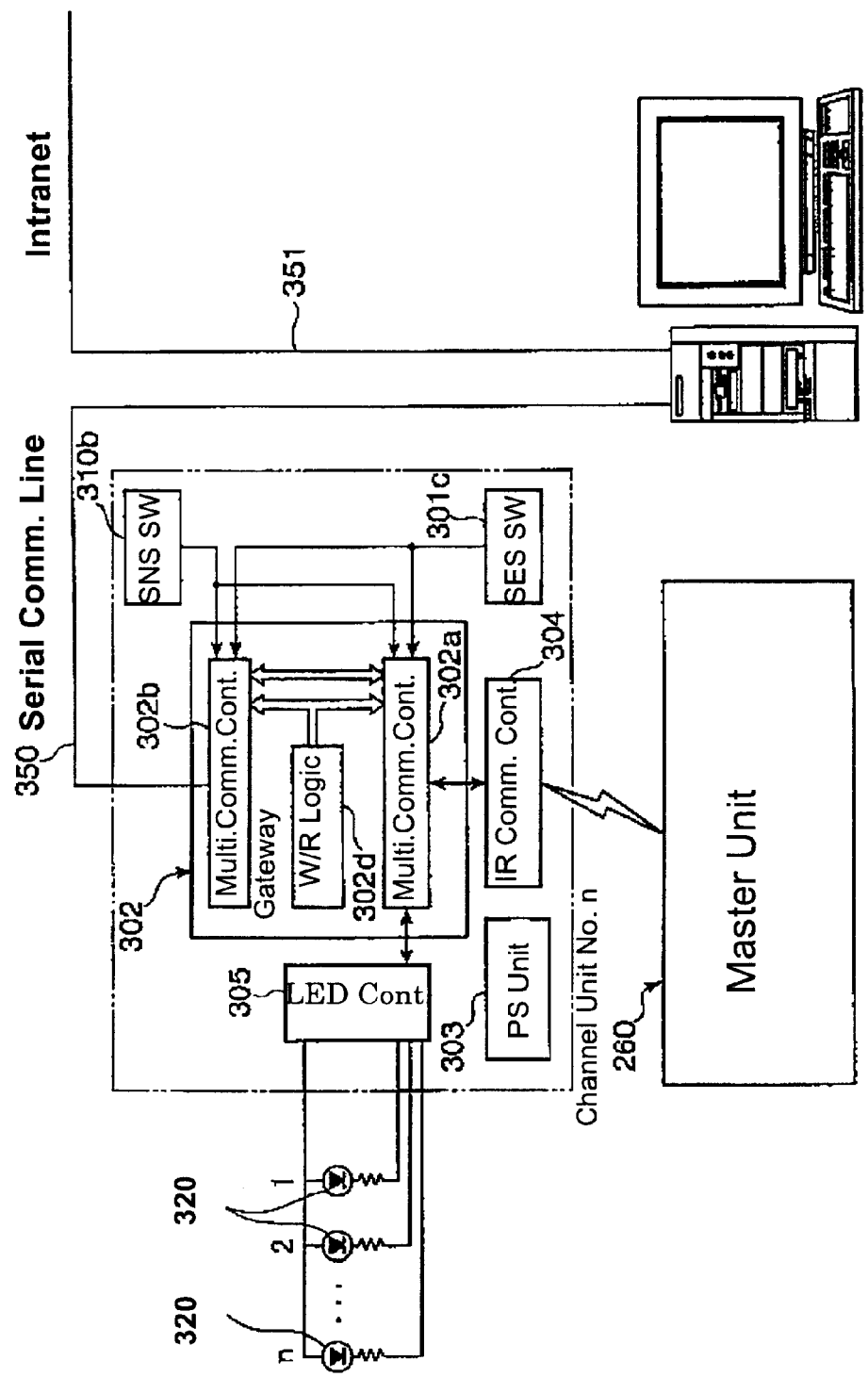
FIG. 11 is a block diagram showing a wired state of the channel unit.

In the embodiment of FIG. 11, the infrared communication unit 304 in each channel unit 300 is connected with the computer 400 via the serial communication cable 350, and can monitor a state of communication between the master unit 260 and the channel unit 300. Thus, connecting operation information in each master unit 260 can be monitored as production administration information, and various operations can be administered.

With reference to FIG. 12, the multiplexing communication controllers 252a, 262a, 302a of the respective units 250, 260, 300 include token receiving circuits 2521, 2621, 3021 for receiving the tokens from a bus B forming the LAN; data receiving and deciphering circuits 2523, 2623, 3023 for receiving and deciphering data from the bus B; data transmitting circuits 2524, 2624, 3024 for transmitting the data upon the receipt of output signals of the data receiving and deciphering circuits 2523, 2623, 3023; and timing clocks 2525, 2625, 3025. In FIG. 12, the bus B forms a bus-shaped network, and a network terminal TN is provided at its terminus.

The self node addresses and the sending-end node addresses set by the respective address setting portions 266f, 266e (see FIG. 8) of the CPU 266 are inputted to the token receiving circuits 2521 of the master unit 260, whereby the node addresses of all the units 250, 260, 300 and the tokens can be related to each other.

On the other hand, the token receiving circuits 2521, 3021 of the respective units 250, 300, excluding that of the master unit 260, are connected with the self node address setting switches 251b, 301b and the sending-end node address setting switches 251c, 301c, and the node addresses of all the units 250, 260, 300 and the tokens can be related to each other by the setting switches 251b, 301b, 251c, 301c.

The multiplexing communication controller 262a of the master unit 260 has a token issuing circuit 2622 for issuing tokens upon the receipt of an output signal of the token receiving circuit 2621, so that the tokens can be given to the respective units 250, 300 by a method to be described later.

This token issuing circuit 2622 gives the tokens to all the units 250, 260, 300 at timings of output bit sets BN by outputting the timing bit sets at specified intervals as token signals.

Figure 13:
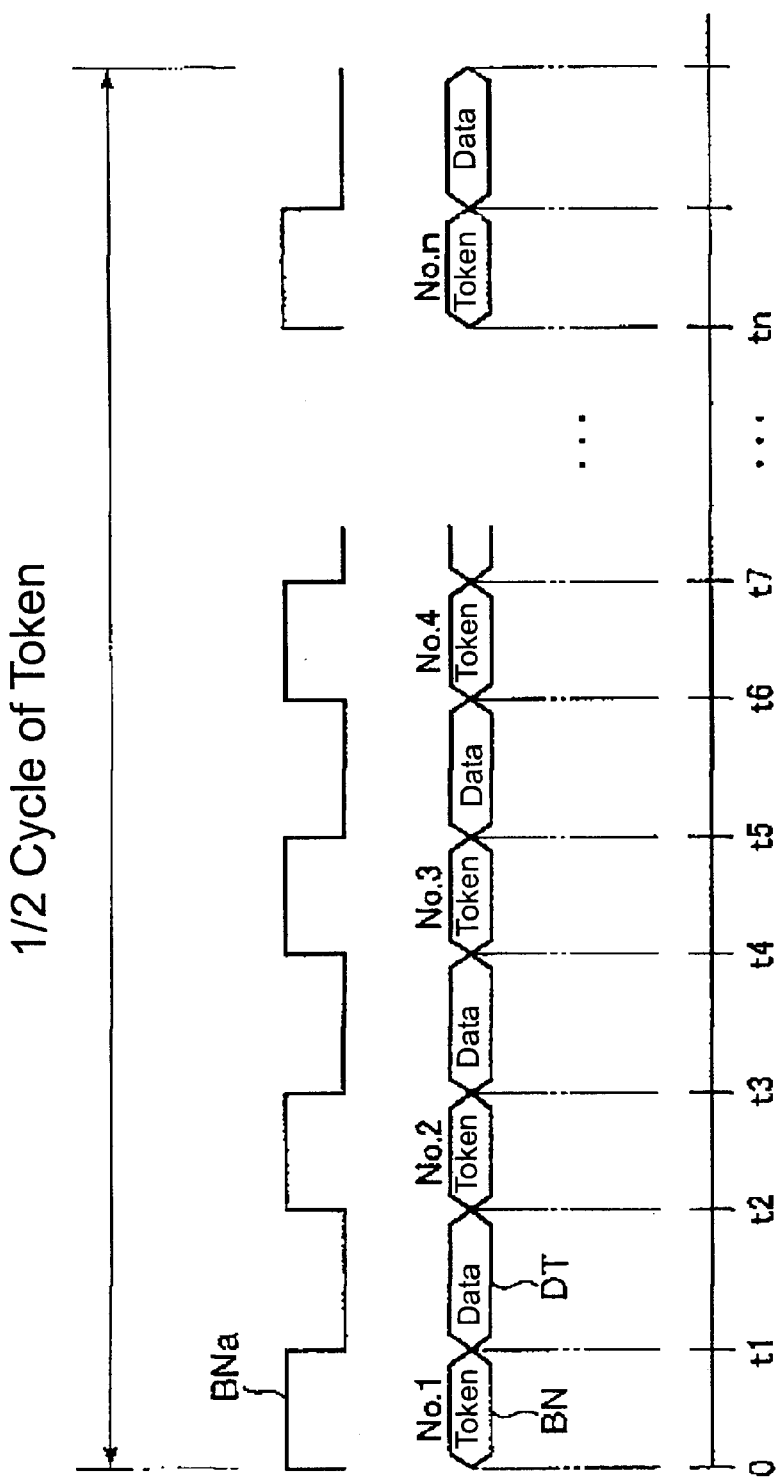
FIG. 13 is a diagram showing a state of a perfect time-division multiplexing communication by the master unit according to the invention.
Figure 14:
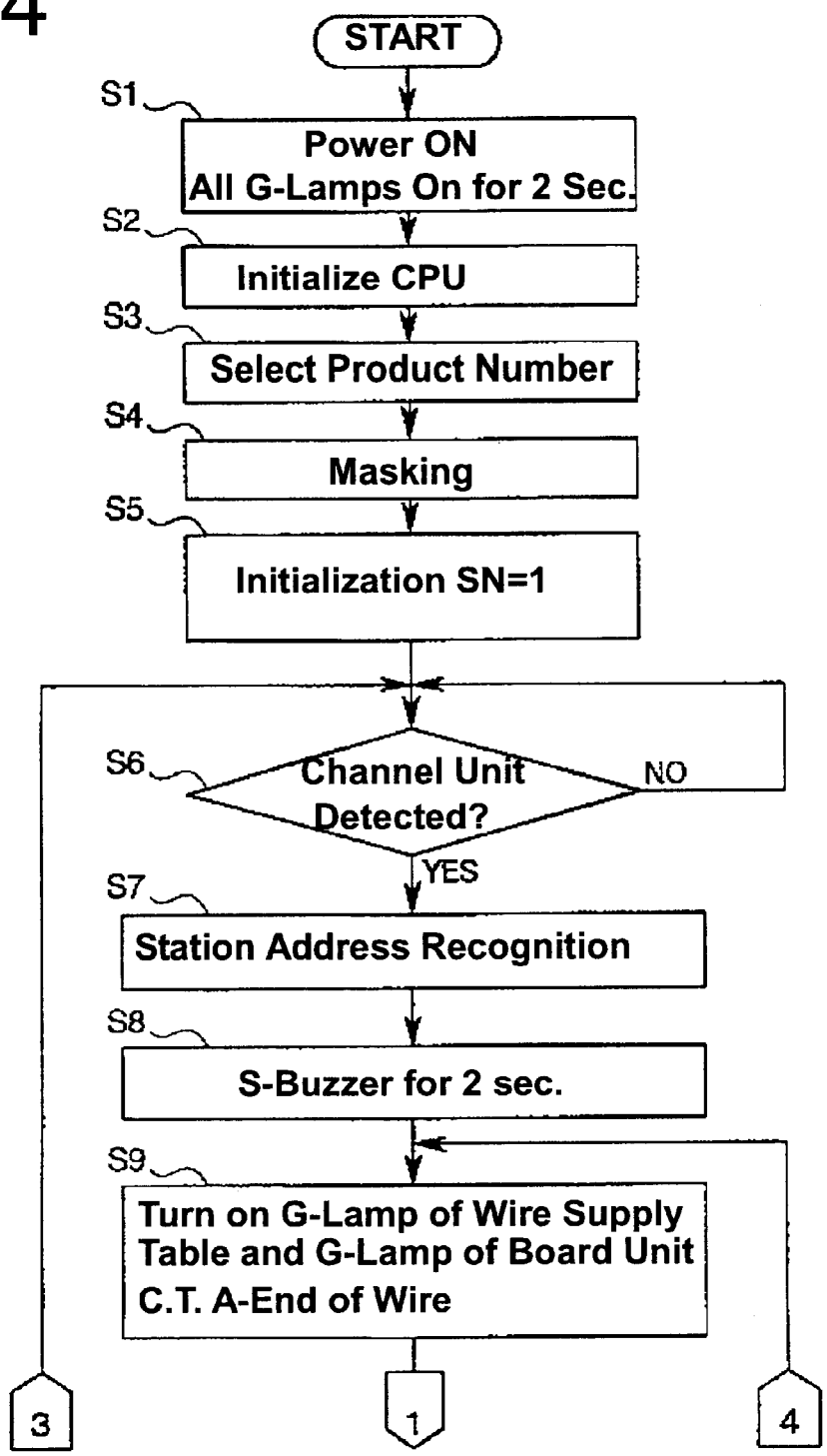
FIG. 14 is a flow chart showing the detail of a connecting process according to the invention.

The horizontal axis of FIG. 13 represents time, BNa and BN denote an issuing cycle of token signals issued by the token issuing circuit 2622 and a timing bit set issued as the token signal, respectively. An output is made by a frequency-modulation method adopting a broadband system.

In this embodiment, the token issuing circuit 2622 of the master unit 260 repeatedly issues the token signal in a cycle of a period between 0 and t2. This token issuing circuit 2622 issues the token signals as a timing marker during the front halves of the cycles 0 to t1, t2 to t3, t4 to t5, t6 to t7, etc., whereas the units 250, 260, 300 having the node addresses coinciding with those of the issued token signal output data DT to the bus B during the rear halves of the cycles t1 to t2, t3 to t4, t5 to t6, etc. In this way, the master unit 250 can give the tokens to all the units including itself by successively repeating the issuance of the timing bit set BN by the number of the units.

As shown in FIG. 12, the token receiving circuits 2521, 2621, 3021 and the data receiving and deciphering circuits 2523, 2623, 3023 in the respective units 250, 260, 300 monitor the common bus B to which the token signals BN and the data DT are outputted. Thus, data DT outputted from any of these units can be shared. As a result, a single database built in the storage 262b of the master unit 260 can be shared by all the connector units 250 and channel units 300.

Waiting time between the issuance of the token signal BN and the input to the master unit 260 of the data DT corresponding to this issued token signal is shortened by programming the electrical connection test to issue the token signal BN 2N times within one cycle of the token upon conducting the communication with N connector units 250. The data output is required in the first N issuing cycles while the data outputted from the connector units 250 are written in the RAM in the latter N issuance cycles (see FIG. 18).

In this embodiment, a multiplexing communication control system adopting a perfect time-division multiplexing communication method is constructed by the multiplexing communication controllers 252a, 262a, 302a, the communication cables and the like.

A connecting process performed during the formation of the subassembly is described with reference to FIGS. 1, 14 to 17. With reference to FIG. 1, the assembling board unit 30 is hand-conveyed intermittently from upstream to downstream stations ST by the conveyor 20 in the subassembly line SL, as described above, and the operation of connecting the terminated wires W is performed at each station ST.

In this connecting operation, all connectors C necessary to form the subassembly are mounted in the connector holders 211 arranged beforehand on the assembling board unit 30, and the power switch 261m (see FIG. 7(B)) of the master unit 260 and the power switch 303b (see FIG. 10(C)) of the channel unit 300 are operated to turn these units 260, 300 on.

The master unit 260 turns on all guide lamps 240, 291 for a specified time, e.g. for 2 sec. (Step S1) and initializes the CPU 266 (Step S2). Thus, the operator can check whether the respective lamps are in order, and can identify any abnormality of the guide lamps 240, 291 before the connecting operation.

Next, the controller 262 of the master unit 260 develops the product number data selected by the product number switching device 268g based on the product number set beforehand by the setting switches 261a to 261f (Step S3). It is also possible that the product number is read by a suitable reader (not shown), e.g. a bar code reader.

Upon the development of this data, the instruction processor 268d of the master unit 260 performs masking (Step S4). In this masking, the wire instructing device 427 selects the probes 220 requiring no signal processing and excludes the probes 220 and the corresponding guide lamps 240 from the objects to be controlled, thereby preventing an erroneous operation.

Next, the controller 262 initializes a step number SN (see FIG. 9) used to administer the process of connecting the terminated wires W (Step S5). In this way, the master unit 260 can specify the address "n" of the wire supply table 40 to be controlled and the step number SN.

Upon the completion of the respective operations in Steps S1 to S5 by the controller 262, the infrared communication unit 264 of the master unit 260 waits on standby until being connected with the infrared communication unit 304 of the channel unit 300 (Step S6). When the assembling board unit 30 arrives at the first station ST in this state, a communication is established between the infrared communication units 264, 304 of the master unit 260 and the channel unit 300. Thus, the CPU 266 recognizes the station address "n" set in the station address setting portion 306 of the channel unit 300 (Step S7). Subsequently, a success buzzer is driven for 2 sec. and the station address "n" is displayed on the station display panel 261h (Step S8). The instructing device 268d then turns on the guide lamp 320 of the wire supply table 40 corresponding to the first terminated wire W and the guide lamp controllers 268b, 268c turn on the guide lamp 240 of the connector holder 211 that holds the connector to be connected with the A-end of this terminated wire W (Step S9). In this way, the operator is instructed to take the terminated wire W out of the channel section 41 corresponding to the turned-on guide lamp 320 and connects the A-end thereof with the connector C in the connector holder 211 indicated by the guide lamp 240.

The CPU 266 waits in Step S10 until the A-end of the terminated wire W is inserted after the guide lamps 240, 320 are turned on. This discrimination is made by detecting a voltage change in the corresponding probe 220. Specifically, the terminal T of the terminated wire W inserted into the terminal cavity of the connector C pushes first rod 222 of the probe 220, thereby displacing the second rod 223 below the first rod 222 (refer to FIG. 4B). Thus, the second rod 223 is disconnected electrically from a sleeve 221 and from the ground. As a result, the connection of the A-end can be detected by detecting a voltage change of the second rod 223 increased by the detection current.

Figure 10:
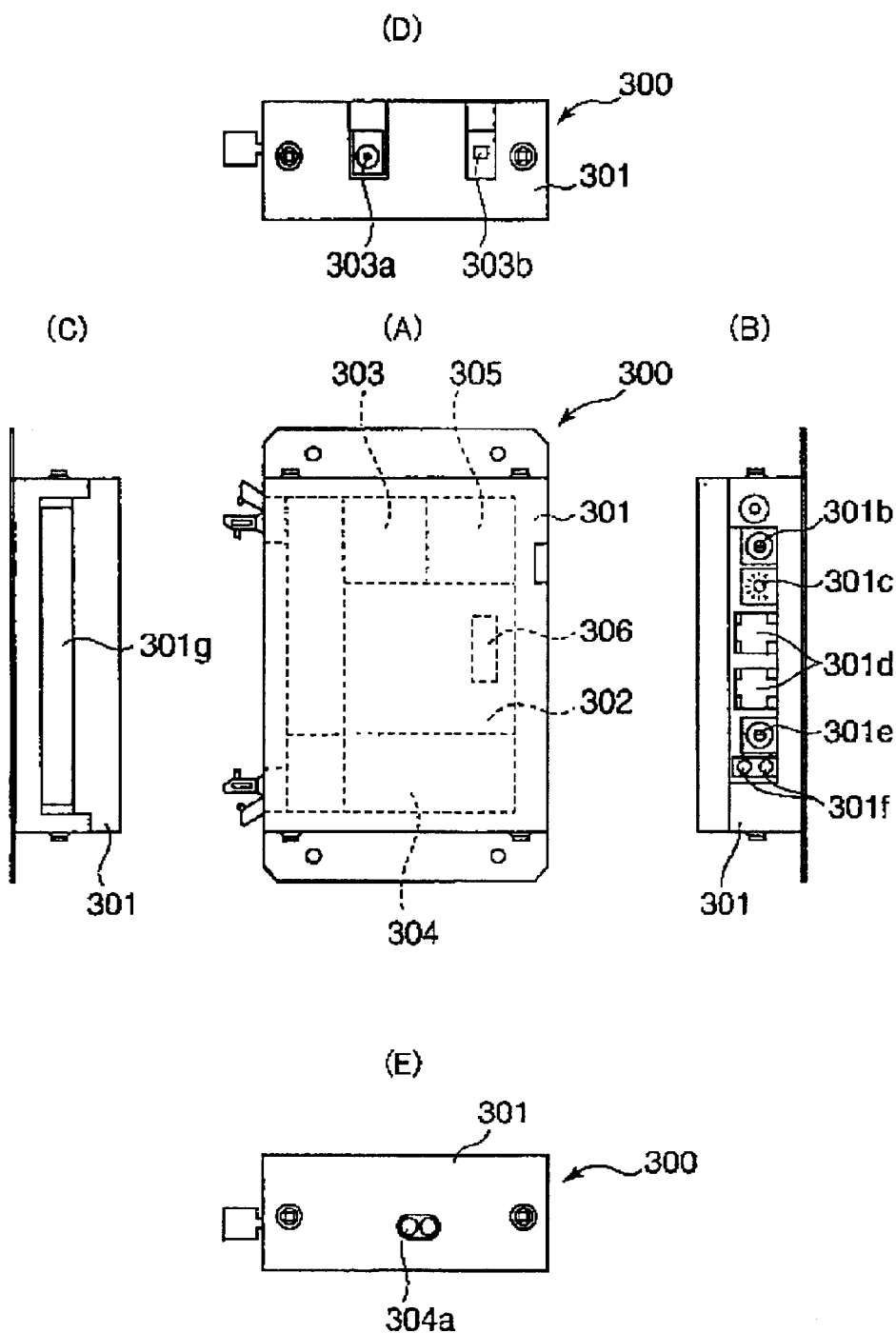
FIGS. 10(A), 10(B), 10(C), 10(D) and 10(E) are a front view, a right side view, a left side view, a plan view and a bottom view showing the external construction of the channel unit.

The electrical connection testing device 268e of the CPU 266 next checks in Steps S11, S12 of FIG. 10 whether the A-end of the terminated wire W is connected with a proper contact. A buzzer controller 266c of the CPU 266 drives the buzzer 263 to notify the operator of an erroneous connection (Step S13) if the terminated wire W is not connected with the proper contact. In such a case, the insertion position is corrected (Step S14) and this routine returns to Step S10 again.

Figure 15:
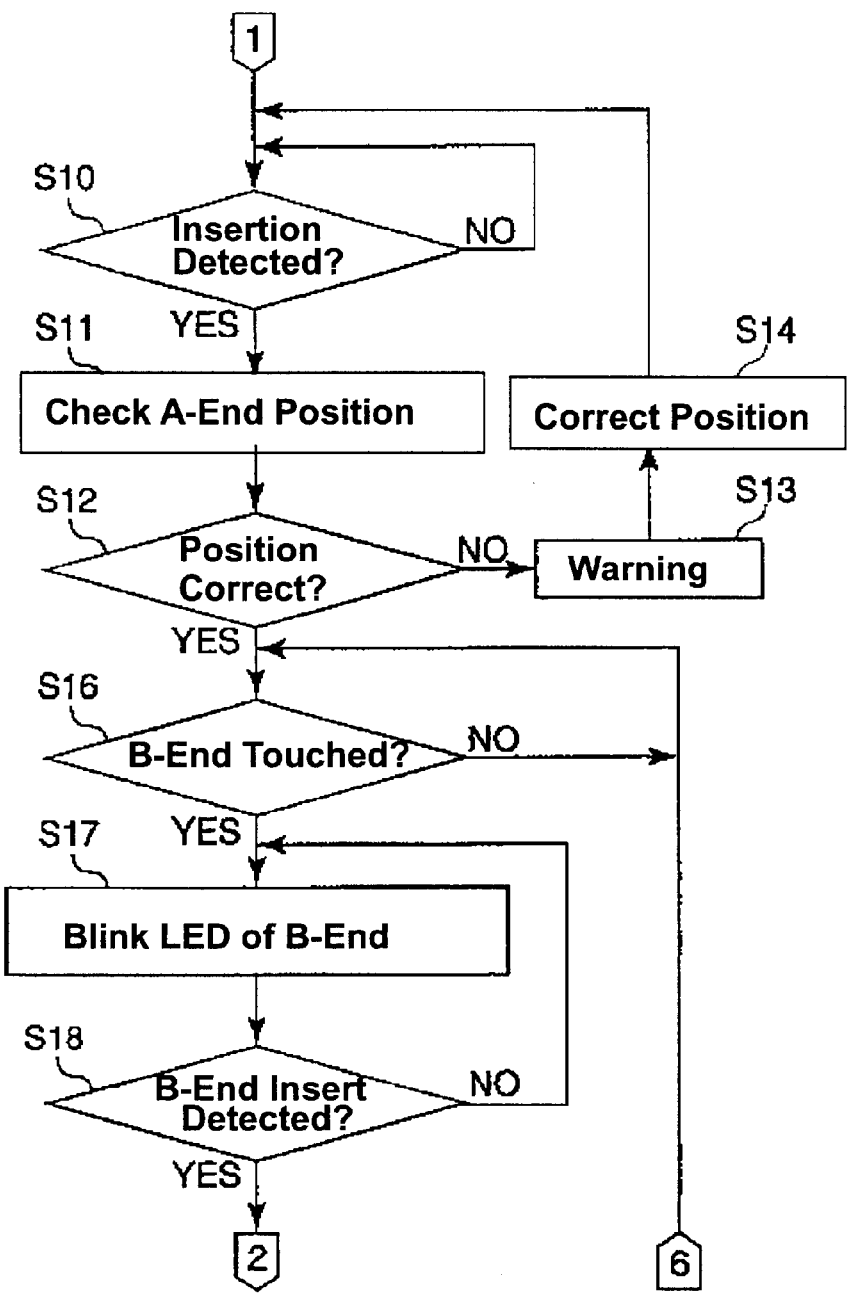
FIG. 15 is a flow chart showing the detail of the connecting process according to the invention.

If the A-end is connected properly, Step S16 of FIG. 15 follows to wait until the operator brings the B-end of the terminated wire W corresponding to the connected A-end into contact with the touch plate 245.

Step S17 of FIG. 15 follows when the operator brings the B-end into contact with the touch plate 245, and the voltage of the probe 220 corresponding to the A-end falls again. In this way, the connection assisting device 268 of the CPU 266 can specify the guide lamp 240 to be turned on. The guide lamp processor 268b in turn blinks the corresponding guide lamp 240 or guide lamp 291. The guide lamp 240 corresponding to the A-end and the guide lamp 240 corresponding to the B-end are used simultaneously. Therefore, the B-end guide lamp 240 is blinked so that the indications of the A-end and B-end can be distinguished from each other. The guide lamp 240 corresponding to the A-end is kept turned on during the process of instructing the connection of the B-end. Then, in Step S18, it is waited until the terminal T at the B-end is connected to the respective connector C.

Upon seeing the guide lamp 240 turned on, the operator inserts the terminal T at the B-end into the corresponding terminal cavity of the connector C. Then, similar to the case of the A-end, an output voltage of the probe 220 corresponding to the terminal T at the B-end changes. Thus, the CPU 266 can discriminate (Step S18) the connection of the terminal T at the B-end and its position of connection (contact).

The terminal T brought into contact with the touch plate 245 may be a later-inserted terminal. In this case, the instructing device 268d turns on the guide lamp 291 of the corresponding temporarily holding jig 290 only while the terminal T is held in contact with the touch plate 245.

Figure 16:
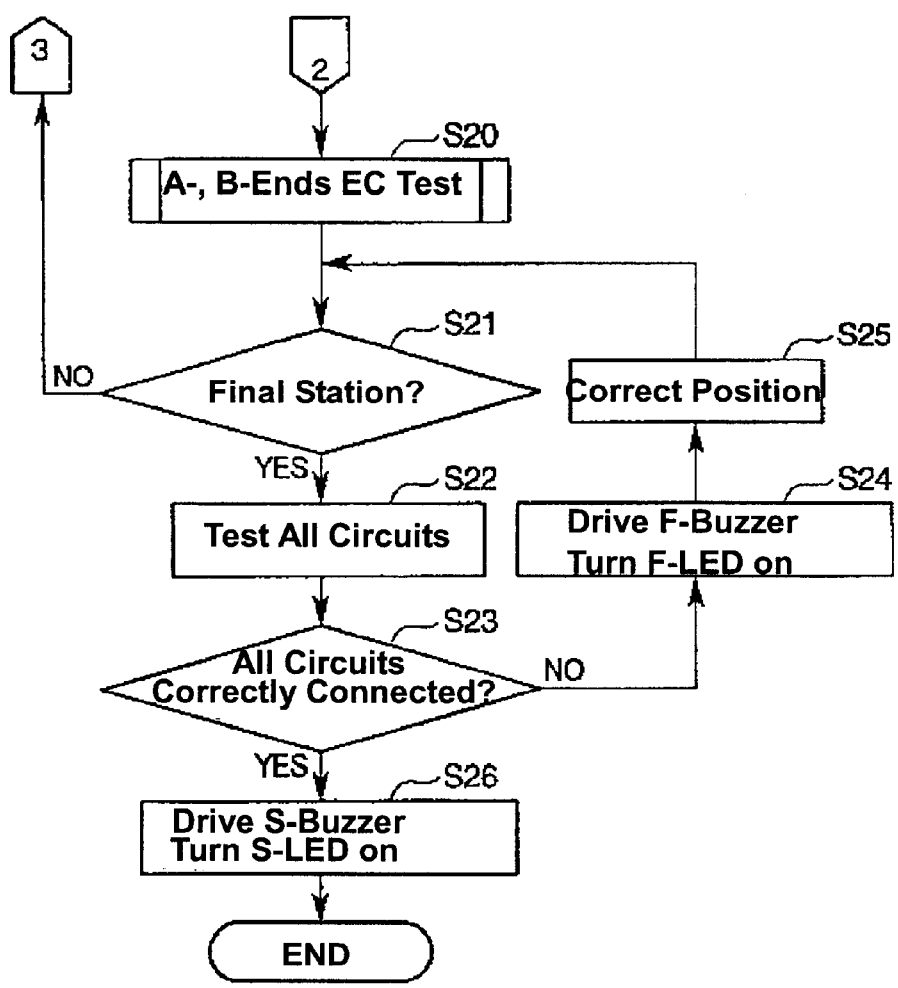
FIG. 16 is a flow chart showing the detail of the connecting process according to the invention.

The electrical connection testing device 268e of the CPU 266 conducts the electrical connection test for the connected terminated wire W in Step S20 of FIG. 16 when the terminal T at the B-end is connected. Upon completion of this electrical connection test, the CPU 266 judges whether the station ST where the connecting process is being performed is the last station. In the case of the last station ST, Step S22 follows, in which the electrical connection test is conducted for all circuits of the wiring harness on the assembling board 100.

In this electrical connection testing step (Step S22), the CPU 266 controls an input/output device 252d, and causes the output voltages of the probes 220 corresponding to the A-ends to fall one by one to a ground level while checking the output voltages of the respective probes 220 corresponding to the B-ends, thereby testing the connected states of the circuits (Step S23). If an erroneous connection is detected, the buzzer 263 is driven and the corresponding guide lamp 240 is blinked to notify an error (Step S24). The operator then can correct this error accordingly (Step S25).

On the other hand, in the case of passing the electrical connection test, Step S26 follows, in which the buzzer 263 is driven to notify a success. The success and failure notifications by the buzzer 263 may be made distinguishable one from the other by setting a long buzzing sound for the one while setting a short buzzing sound for the other, by setting different frequencies for the respective sounds, or the like.

Figure 17:
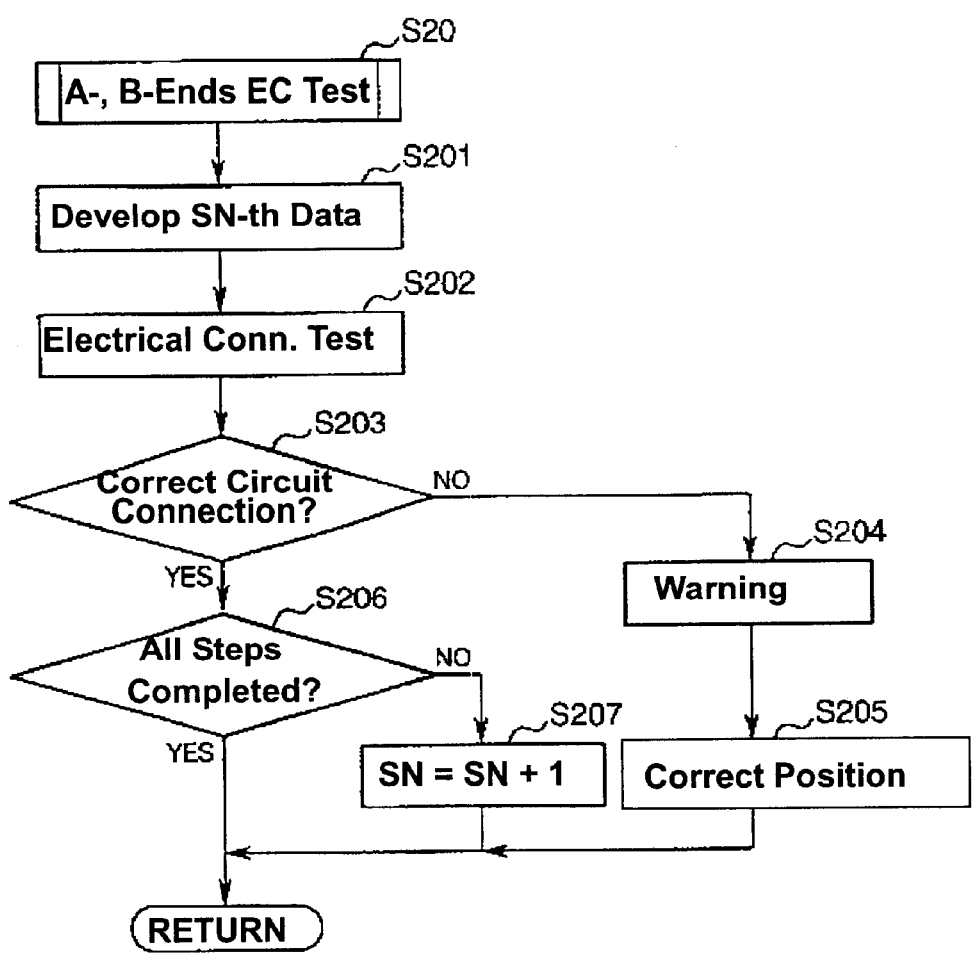
FIG. 17 is a flow chart showing the detail of the connecting process according to the invention.

FIG. 17 is a flow chart showing the detail of Step S20 of FIG. 16, and develops instep S201 the test standard data (see FIG. 9) of the step number SN to be handled. Subsequently, in Step S202, the electrical connection test is conducted based on the developed test standard data stored in the test standard data storage section 269b.

If the connected state of the terminated wire W is different from a proper connected state stored beforehand in the storage 262b, the CPU 266 judges a failure in the connection of the B-end and the buzzer 263 indicates an error (Step S204). Accordingly, the operator can correct the connection of the B-end (Step S205).

On the other hand, upon judging that the connection of the B-end is as specified, the CPU 266 turns off the guide lamps 240 corresponding to the connected terminated wire W and determines in Step S206 of FIG. 17 whether all the connecting operations at the station ST have been completed. The subroutine immediately returns to the flow of FIG. 16 after all the terminated wires W have been connected. On the other hand, the subroutine returns to the flow of FIG. 16 after the step number SN is renewed in Step S207, if any terminated wire W remains to be connected, and the procedure described above is repeated. The electrical connection test is conducted in Step S20 every time the B-end of the terminated wire W is connected. The electrical connection test information of the network built by the terminated wires W is stored as the test standard data in the test standard data storage section 262b, for each terminated wire W up to the final stage. Additionally, the CPU 266, as a discriminating means, develops the test standard data cumulatively stored in Step S201 and conducts the electrical connection test (Step S20) based on the developed test standard data. Thus, the electrical connection test determines whether the network is proper every time the terminated wire W is connected in the production process of the wiring harness.

Figure 18:
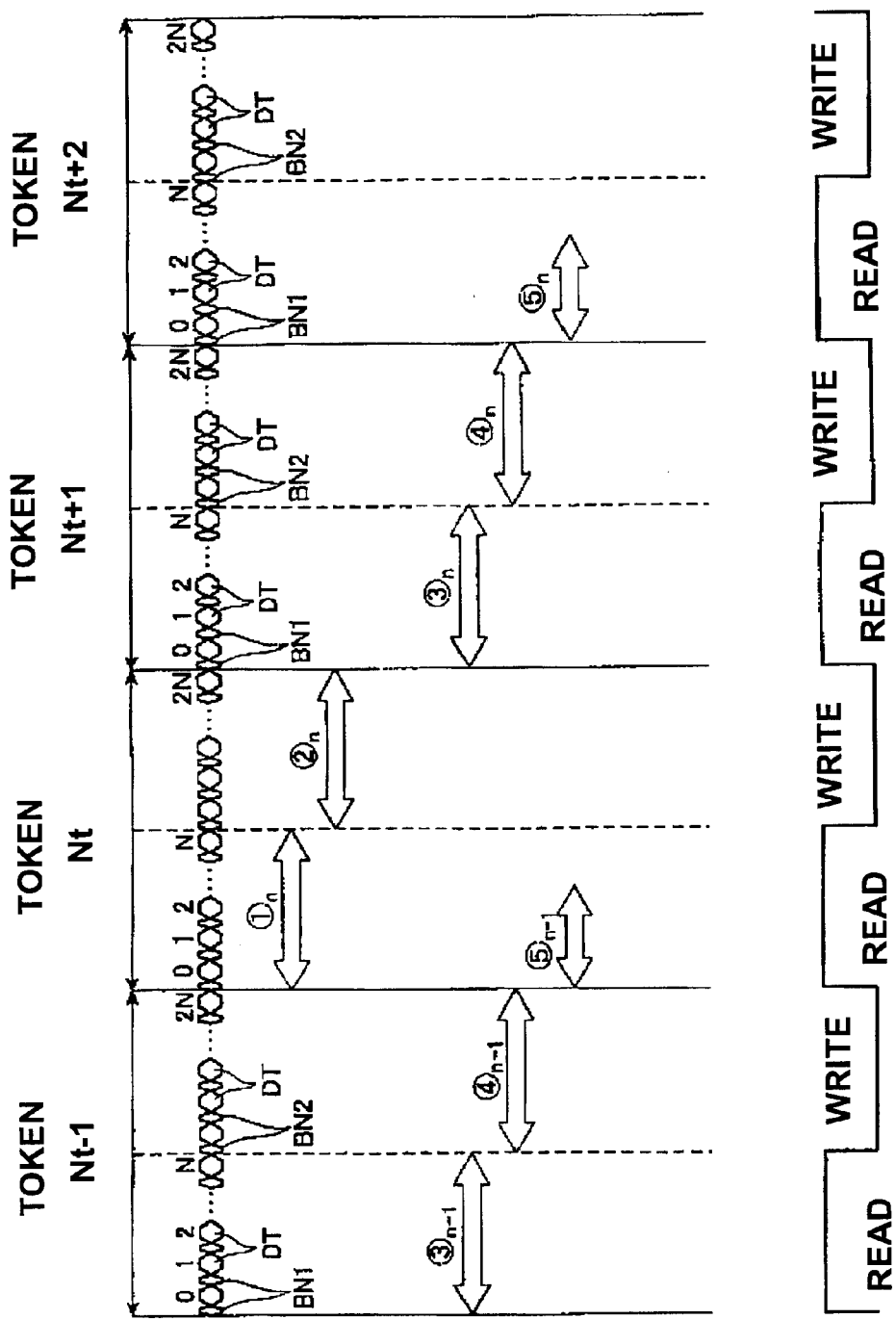
FIG. 18 is a timing chart showing an example of specific signal processing when a multiplexing communication method according to the embodiment is applied to an electrical connection test.

A data processing procedure for conducting the electrical connection test in the aforementioned connection assisting process is described with reference to FIG. 18. FIG. 18 is a timing chart showing a specific example of signal processing in the case that the multiplexing communication method of this embodiment is applied to the electrical connection test.

In the shown embodiment, the same number of bit sets BN1 as the number N of all the connector units 250 connected with the bus B are outputted in the first half of one cycle of the token, thereby letting the respective connector units 250 receive the tokens. Similarly, the same number of bit sets BN2 are outputted in the second half of one cycle of the token, thereby sending data packets to the slave nodes required to output the data.

As shown in FIG. 18, one electrical connection test is conducted during a period of 2.5 cycles of the token (e.g. Nt to Nt+2). During this period, N (e.g. 64) bit sets BN1 are outputted from the master unit 260 since a test signal used to conduct the electrical connection test is outputted in the first half ①n of the token cycle Nt based on the read data of the network decided in preceding cycle Nt−1.

Subsequently, the bit sets BN2 for sending out the data packets are sent in the second half ②n of this cycle Nt, whereby the read data of the network outputted from the probes 220 of the connector holders 211 are written in the read data storage sections 269c of the connector units 250. However, the data at this time is ignored to take into account a time jitter possibly caused by a stray capacity of the wiring network. The readout is performed preferably at a readout time delayed by a specified time with respect to the input signal, which is greater than the possible time jitter caused by the stray capacity. Accordingly, it is possible to guarantee a response time of the system in contrast to a CSMA/CD protocol according to prior art.

The read data are canceled in the second half ②n. Thus, the read data of the network decided in the section ①n are maintained when the bit sets BN1 are outputted from the master unit 260 to the connector units 250 in first half ③n of a next cycle Nt+1.

Subsequently, the bit sets BN2 for sending out the data packet are sent in the second half ④n of the cycle Nt+1, and the read data of the network are written in the read data storage section 269c of the master unit 260. The electrical connection testing device 268e compares the read data with the corresponding test standard data to discriminate a success or a failure during an interval ⑤n. In parallel, the bit sets BN1 are outputted in the first half of a cycle Nt+2 of the token, and the read data are decided for a next electrical connection test during this interval.

The test is conducted again retroactively to the interval ④n−1 of the cycle Nt−1 if an error in picking up the signals occurs in the electrical connection test (Step S20) during the interval ⑤n.

As described above, the perfect time-division multiplexing communication method transmits and receives data while causing the timings of the token signals BN and the node addresses to coincide by outputting the token signals BN at the specified intervals. This method is adopted for the wire connecting operation and causes cooperation between the guide lamps 240, 291 on the assembling board 100 and the guide lamps 320 for each of the plurality of stations ST. Thus, it is not necessary to establish the communication conditions between the master unit 260, the connector units 250 and the channel units 300 as the nodes for transmitting and receiving the data, and the data can be transmitted and received without a protocol. This remarkably shortens the response time between the master unit 260, the connector units 250 and the channel units 300 for transmitting and receiving the data. Thus, the guide lamps 240, 291, 320 can be controlled at a practical speed, even if the wires are instructed to the guide lamps 240, 291, 320 in a complicated manner. This enables a unitary administration of the connection assisting information and the electrical connection test information of the large wiring harness by the master unit 260 using the single database, and the data can be administered and renewed more easily. Further, the protocol-free communication mode avoids the need to develop software for establishing a protocol between the master unit 260, the connector units 250 and the channel units 300. Hence, a cost reduction is achieved.

The connector units 250 can be arranged within an area where wiring is simplified considerably even if the number of the circuits of the wiring harness is relatively large. As a result, the electrical connection tests, the connection assistance or the multiplexing communication with electronic devices connected with the wiring harness can be performed while a wiring harness having a large number of circuits (e.g. 200 to 300 circuits) can be placed on the assembling board 100 having such an area that the wiring harness cannot be physically placed in the prior art.

The perfect time-division multiplexing communication method avoids the need to have the master unit 260 establish communication conditions with the connector units 250 and the channel units 300. This eliminates the need for microprocessors in the connector units 250 and the channel units 300. Thus, simple and inexpensive hardware can be adopted.

The multiplexing communication between the master unit 260, the connector units 250 and the channel units 300 enables wiring between the respective units 250, 260, 300 to be simplified, and the electrical connection tests and the connection assistance can be performed on a compact assembling board 100 even if the wiring harness has a relatively large number of circuits (e.g. having 960 contacts).

The perfect time-division multiplexing communication method enables multiplexing communications between the respective units 250, 260, 300 merely by setting the timing bit sets BN outputted at the specified intervals and the node addresses. Thus, the connector units 250 and the channel units 300 can be increased and decreased easily, and a change in the hardware specification of the wiring harness can be dealt with easily.

The master unit 260 tests the electrical connection of the network, including the connected terminated wire W, every time the terminated wire W is connected with the connector C in the connector holder 211, and causes the respective connection instructing means to carry out the next connection assistance only in the case of a success in the electrical connection test. Thus, an error connection can be detected by a real-time response, thereby preventing a defective product from being conveyed to a later step. Further, the perfect time-division multiplexing communication method remarkably shortens the time required for the electrical connection test. Thus, a processing time between one set of the connecting operation and the electrical connection testing operation and the next set can be shortened, and that the operator need not spend time waiting.

The wire supply table 40 is installed at each of the stations ST along a conveyance path for the assembling boards 100, and the master unit 260 is constructed to test the electrical connection up to the final stage of the production process of the wiring harness being tested. Thus, the instruction of the wire connection and the electrical connection test can be carried out seamlessly from the first station ST to the last station ST. Therefore, even if the operator is changed between the respective stations ST or the operation is interrupted, there is no variation in the quality of the connecting operations.

The tokens are given by the perfect time-division method according to which the same number of the bit sets BN1 for the reading of the tokens and the bit sets BN2 for the data packets as the total number of the connector unit are set. Thus, even if a plurality of connector holders are provided and the harness-forming wires are connected randomly with the connectors, a communication speed can quickly follow such an action.

Further, the data reading interval ②n following the interval ①n during which the data on the wiring network are outputted in the procedure described with respect to FIG. 18 is set as a data canceling interval. Thus, a delay caused by the floating capacity of the wiring network is avoided automatically.

Further, the master unit 260 and the channel units 300 can conduct a wireless communication by means of the infrared communication units 264, 304, transmitters and receivers, or the like provided therein. Accordingly, the wire-side connection instructing means (guide lamps 320, etc.) of each station ST and the master unit 260 can be connected and disconnected easily even if one assembling board 100 is conveyed to a plurality of stations ST. Therefore, operability can be improved remarkably.

Furthermore, the gateway unit 302 of each channel unit 300 forms a gateway for establishing a communication between a plurality of networks. Therefore, a communication line built with the master unit 260 as a center can be connected with external networks (e.g. Intranet 351) to enable multiplexing communication without establishing the communication conditions between the master unit 260 and the other networks (Intranet 351), thereby enabling various operations to be performed. For example, the data can be taught to remotely and changed in the storage 262b of the master unit 260 by way of the Intranet 351. Further, the behavior of the wire connection assisting system that has the master unit 260 as a center can be monitored as it is via the Intranet 351, and supplementary functions of the wire connection assisting system such as maintenance and warnings can be added.

Mixed production of many kinds of subassemblies in the same subassembly line SL can be achieved without inputting pieces of production information of the individual subassemblies in the wire supply tables 40, because a master unit 260 is on each assembling board 100 and the information of the single database built in the storage 262b of each master unit 260 can be shared by all the connector units 250 and channel units 300 in all the stations ST. Thus, preparation for the production of the subassemblies is considerably easier. In addition, even if a problem, such as a defective product or a trouble occurs on any of the assembling boards 100 while a plurality of assembling boards 100 are being conveyed in the subassembly line SL, the guide lamps of the wire supply tables 40 may be controlled individually by the master units 260 on the respective assembling boards 100 and caused to cooperate with the guide lamps 240 of the connector holders 211 on the assembling boards 100. Thus, such a problem has no influence on the connecting operations on the other assembling boards 100. From this viewpoint as well, a reduction in the operability can be suppressed maximally.

The information of the single database is shared and the connecting operations are assisted in all the stations ST. Thus, it is not necessary to provide a means for preventing a connection error of the operator by sorting the insulated wires of the products by colors. As a result, the kinds of the insulated wires can be reduced and the production cost can be reduced.

Accordingly, this embodiment has marvelous effects that large-side subassemblies can be produced efficiently by easily and precisely performing the wire connecting operations set for the respective stations ST on the same assembling board, and that the mixed production can be dealt with flexibly.

The assembling board 100 has temporarily holding jigs 290 for temporarily holding the other ends of the terminated wires W set as free terminals to be connected when the subassembly is assembled into a wiring harness e.g. at a later stage. Additionally, the terminal insertion assisting unit 200 is provided for each temporarily holding jig 290 and includes the guide lamp 291 (terminus end instructing means) for instructing the temporary holding jig 290 when the other end as the free terminal is brought into contact with the touch plate 245. Thus, if the subassembly includes "free terminals" to be connected when the subassembly is assembled into a wiring harness, suitable temporarily holding positions can be instructed for the individual free terminals upon temporarily holding the free terminals at a plurality of positions. As a result the wire connecting operation can be performed efficiently.

The above described embodiment is a mere illustration of a preferable example of the invention, and the invention is not limited thereto. It should be appreciated that various design changes can be made without departing the scope of the present invention as claimed.

As described above, the present invention has an advantageous effect that the electrical connection test can be conducted within a practical response time every time the harness-forming wire is connected on the compact assembling board.

Moreover, as described above, the wire connection is assisted by the perfect time-division multiplexing communication method. Thus, there is an advantageous effect that the operation of connecting the wires of the wiring harness to form a large-scale circuitry can be performed easily, precisely and continuously on the same assembling board based on the connection assisting information built into the single database.

What is claimed is:

1. A processing system (10) for a wiring harness to be provided in a production line for producing the wiring harness by conveying a connection board (100) from one to another of a plurality of stations (ST) and connecting harness-forming wires (W) to form the wiring harness on the connection board (100), and having a function of, substantially every time the harness-forming wire (W) is connected, testing (S20) an electrical connection of at least part of a network of the wiring harness including the connected harness-forming wire (W), comprising:

a master unit (260) for conducting an electrical connection test (S20) for the wiring harness being produced, a plurality of connector units (250) which are at least temporarily connected with the master unit (260) to enable a multiplexing communication and which can exchange signals with at least part of the wiring harness, a multiplexing communication path (B) for connecting the master unit (260) and the respective connector units (250) to enable the multiplexing communication therebetween, wherein:

different node addresses are set for the master unit (260) and the respective connector units (250), each of the master unit (260) and the connector units (250) comprises a multiplexing communication controller (262a, 252a) adopting a perfect time-division multiplexing communication method according to which tokens (BN) are given to the master unit (260) and the connector units (250) by a time-division technique based on timing bit sets issued at specified intervals from any of the units (260, 250) and the node addresses.

2. The processing system of claim 1, wherein the master unit (260) comprises:

a read data storage means (269c) for storing connection information of the network formed by the newly connected harness-forming wire (W) as a read data based on a data packet (DT) sent from the connector unit (250) via the multiplexing communication with the connector unit (250) by the perfect time-division multiplexing communication method, and a test standard data storage means (269b) for storing test standard data as a standard of the electrical connection test (S20), wherein the test standard data storage means (269b) stores electrical connection test information of the network built by the harness-forming wires (W) as the test standard data up to a final stage for each harness-forming wire (W).

3. The processing system of claim 2, wherein the master unit (260) comprises a discriminating means (266) for determining whether contacts of the network are connected properly by comparing the read data and the test standard data, the discriminating means (266) determining whether the network is satisfactory up to the last stage based on the test standard data every time the harness-forming wire (W) is connected in the production process of the wiring harness being tested.

4. The processing system of claim 1, wherein:
a connector-side connection instructing means (240) which can indicate a connection end of the harness-forming wire (W) is associated with each connector holder (211), and
the master unit (260) further comprises a connection assisting data storage means (269a) for storing connection assisting data for the wiring harness being produced, and a connection instruction control means (200) for controlling connection instruction by the connector-side connection instructing means (240) via the multiplexing communication controller (262a, 252a) based on the read data and the connection assisting data.

5. A method for testing an electrical connection of a network of a wiring harness including harness-forming wires (W) substantially every time the harness-forming wire (W) is connected, the method being adoptable in a production line of producing the wiring harness by conveying a connection board (100) from one to another of a plurality of stations (ST) and connecting the harness-forming wires (W) to form the wiring harness on the connection board (100), comprising the steps of:
setting different node addresses for a master unit (260) for conducting (S20) an electrical connection test for the wiring harness being produced and a plurality of connector units (250) for connecting the master unit (260) at least partly with the wiring harness,
giving tokens (BN) to the respective units (260, 250) by a time-division technique based on timing bit sets issued at specified intervals from any of the units (260, 250) and the node addresses according to a perfect time-division multiplexing communication method, and
determining (S11; S18; S20; S22; S23) whether the network is satisfactory up to a final state by the perfect time-division multiplexing communication method substantially every the harness-forming wire (W) is connected in the production process of the wiring harness being tested.

6. A computer-readable storage medium storing thereon a computer program, which comprises computer-readable program means for causing a computer to control an execution of a method for testing an electrical connection of a network of a wiring harness including harness-forming wires (W) according to claim 5.

7. A wire connection assisting system (10), comprising:
a wire supply (40) for accommodating terminated wires (W) while sorting the terminal-provided wires (W) beforehand according to their kinds,
an assembling board (100) on which the terminal-provided wires (W) taken out from the wire supply (40) are to be connected,
connector holders (211) provided on the assembling board (100) and each including a connector accommodating portion (212) for holding a connector (C) to be connected with the terminal-provided wire (W) taken out from the wire supply (40) and a detecting element (220) electrically connectable with a terminal (T) of the terminated wires (W) inserted into the connector (C) at least partly accommodated in the connector accommodating portion (212),
a wire-side connection instructing means (320) provided at the wire supply (40) for giving an instruction of taking out a specific wire (W) accommodated in the wire supply (40),
connector-side connection instructing means (240) provided in correspondence with the respective connector holders (211) for displaying a connection end corresponding to the connector (C) with which the taken-out terminated wire (W) is to be connected,
a master unit (260) provided on the assembling board (100) to be at least temporarily electrically connectable with the respective detecting elements (220) for controlling the respective connection instructing means (320, 240),
a wire-side node unit (300) at least temporarily connected with the master unit (260) in a manner as to enable a multiplexing communication and adapted to drive the wire-side connection instructing means (320) based on a control of the master unit (260),
a connector-side node unit (250) at least temporarily connected with the master unit (260) in such a manner as to enable a multiplexing communication and adapted to control the detecting elements (220) of the connector holders (211) and the wire-side connection instructing means (320) based on the control of the master unit (260), and
a multiplexing communication control system (262a, 252a, 302a) for at least temporarily connecting the master unit (260) and the node unit (300, 250) as nodes so as to enable the multiplexing communication therebetween.

8. The wire connection assisting system of claim 7, wherein the connection of harness-forming wires (W) to form a wiring harness being assisted by controlling (S9) the respective connection instructing means (320, 240) based on an information of a single database (269a; 269b; 269c) built in the master unit (260) and a connection information of the harness-forming wires (W) to be connected with the connectors (C) on the assembling board (100).

9. The wire connection assisting system of claim 8, wherein the multiplexing communication system comprises:
a node address setting means (251b; 251c, 301b; 301c) for setting different node addresses for the respective nodes (250, 300),
a token issuing means (2622) for issuing timing bit sets as token signals (BN) at specified intervals, and
a token reception controller (2521; 2621; 3021) for giving the tokens (BN) to the respective nodes (250; 300) by a time-division technique based on the timing bit sets issued by the token issuing means (2622) and the node addresses.

10. The wire connection assisting system of claim 9, wherein the master unit (260) has a function of testing (S20) an electrical connection of a network including the connected harness-forming wire (W) substantially every time the harness-forming wire (W) is connected with the connector (C) at least partly held in the connector holder (211), and causes the respective connection instructing means (320, 240) to assist a next connecting operation only in the case of a success in an electrical connection test (S20).

11. The wire connection assisting system of claim 10, wherein the wire supply (40) is provided at each of a plurality of stations (ST) installed along a conveyance path along which the assembling board (100) is conveyed, and the master unit (260) tests (S20) the electrical connection up to the last stage of the production process of the wiring harness being tested.

12. The wire connection assisting system of claim 11, wherein the wire-side node unit (300) comprises a gateway (302) for conducting a multiplexing communication with an external network (351).

13. The wire connection assisting system of claim 12, wherein the assembling board (100) comprises:
   a plurality of temporarily holding jigs (290) for temporarily holding the other ends of the terminal-provided wires (W) determined as free terminals to be connected when the subassembly is assembled into the wiring harness at a later stage,
   the connector-side node unit (250) being provided for each of the temporarily holding jigs (290) and is connected with a terminus end instructing means (291) for instructing the temporarily holding jig (290) when the other end as the free terminal (T) is brought into contact with a grounding member (245).

* * * * *